United States Patent
Dozen et al.

(10) Patent No.: US 7,736,958 B2
(45) Date of Patent: Jun. 15, 2010

(54) METHOD FOR MANUFACTURING SEMICONDUCTOR DEVICE

(75) Inventors: Yoshitaka Dozen, Tochigi (JP); Eiji Sugiyama, Tochigi (JP); Hisashi Ohtani, Tochigi (JP); Takuya Tsurume, Atsugi (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 185 days.

(21) Appl. No.: 12/076,149

(22) Filed: Mar. 14, 2008

(65) Prior Publication Data

US 2008/0242005 A1  Oct. 2, 2008

(30) Foreign Application Priority Data

Mar. 26, 2007  (JP) ............... 2007-079120

(51) Int. Cl.
H01L 21/84 (2006.01)
(52) U.S. Cl. ............... 438/155; 438/455; 257/E21.122
(58) Field of Classification Search ............... 438/155, 438/455; 257/E21.122
See application file for complete search history.

(56) References Cited

U.S. PATENT DOCUMENTS

| | | | |
|---|---|---|---|
| 5,075,166 A | 12/1991 | Sikorski et al. | |
| 5,597,631 A | 1/1997 | Furumoto et al. | |
| 5,757,456 A | 5/1998 | Yamazaki et al. | |
| 5,770,313 A | 6/1998 | Furumoto et al. | |
| 5,821,138 A | 10/1998 | Yamazaki et al. | |
| 6,224,965 B1 | 5/2001 | Haas et al. | |
| 6,403,221 B1 | 6/2002 | Nakamura et al. | |
| 6,903,377 B2* | 6/2005 | Yamazaki et al. | 438/151 |
| 7,049,178 B2 | 5/2006 | Kim et al. | |
| 7,061,083 B1 | 6/2006 | Usami et al. | |
| 7,262,464 B2* | 8/2007 | Takafuji et al. | 257/347 |
| 7,485,489 B2 | 2/2009 | Björbell | |
| 2003/0032210 A1 | 2/2003 | Takayama et al. | |
| 2005/0233122 A1 | 10/2005 | Nishimura et al. | |
| 2008/0012126 A1 | 1/2008 | Dozen et al. | |

FOREIGN PATENT DOCUMENTS

| | | |
|---|---|---|
| EP | 1092739 | 4/2001 |
| EP | 1589797 | 10/2005 |
| JP | 05-190582 | 7/1993 |
| JP | 08-250745 | 9/1996 |
| JP | 08-288522 | 11/1996 |

(Continued)

*Primary Examiner*—Chandra Chaudhari
(74) *Attorney, Agent, or Firm*—Eric J. Robinson; Robinson Intellectual Property Law Office, P.C.

(57) ABSTRACT

In the present application, is disclosed a method of manufacturing a flexible semiconductor device having an excellent reliability and tolerance to the loading of external pressure. The method includes the steps of: forming a separation layer over a substrate having an insulating surface; forming an element layer including a semiconductor element comprising a non-single crystal semiconductor layer, over the separation layer; forming an organic resin layer over the element layer; providing a fibrous body formed of an organic compound or an inorganic compound on the organic resin layer; heating the organic resin layer; and separating the element layer from the separation layer. This method allows the formation of a flexible semiconductor device having a sealing layer in which the fibrous body is impregnated with the organic resin.

28 Claims, 16 Drawing Sheets

FOREIGN PATENT DOCUMENTS

| | | |
|---|---|---|
| JP | 10-092980 | 4/1998 |
| JP | 2003-174153 | 6/2003 |
| JP | 2004-078991 | 3/2004 |
| JP | 2004-362341 | 12/2004 |
| WO | WO 01/001740 | 1/2001 |
| WO | WO 2004/001848 | 12/2003 |

* cited by examiner

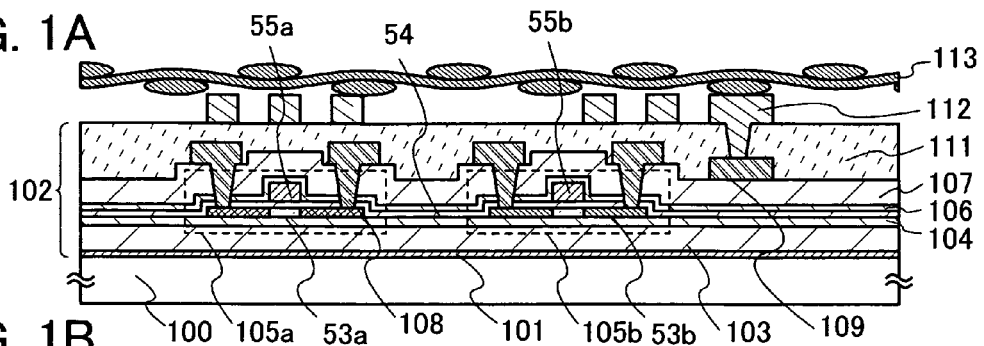
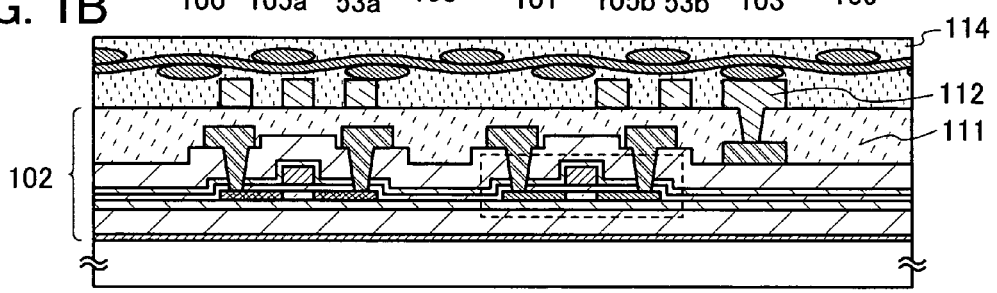
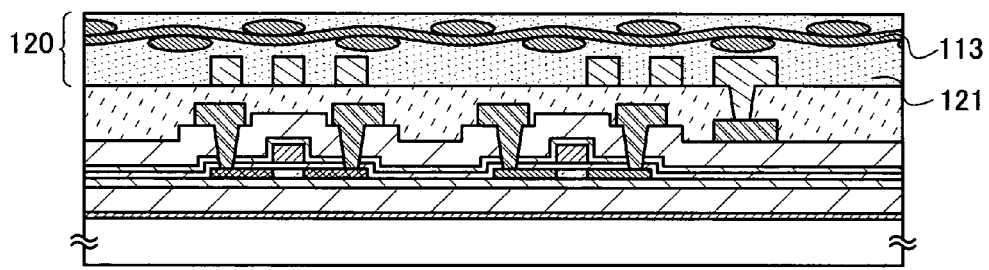
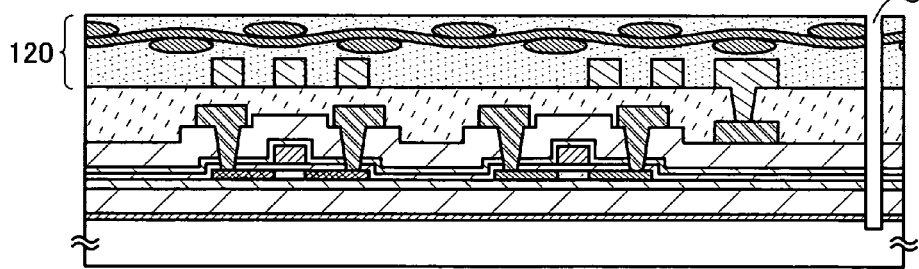
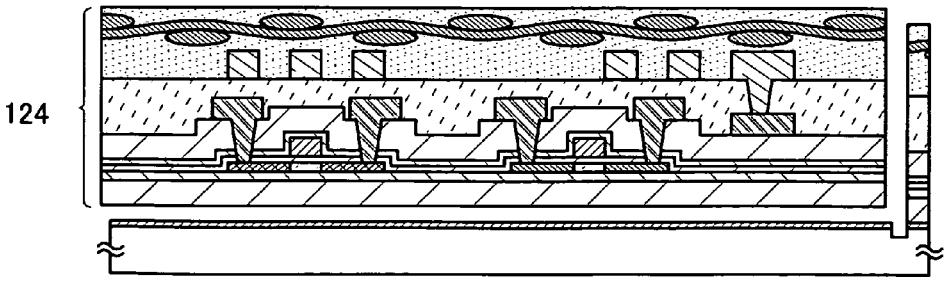

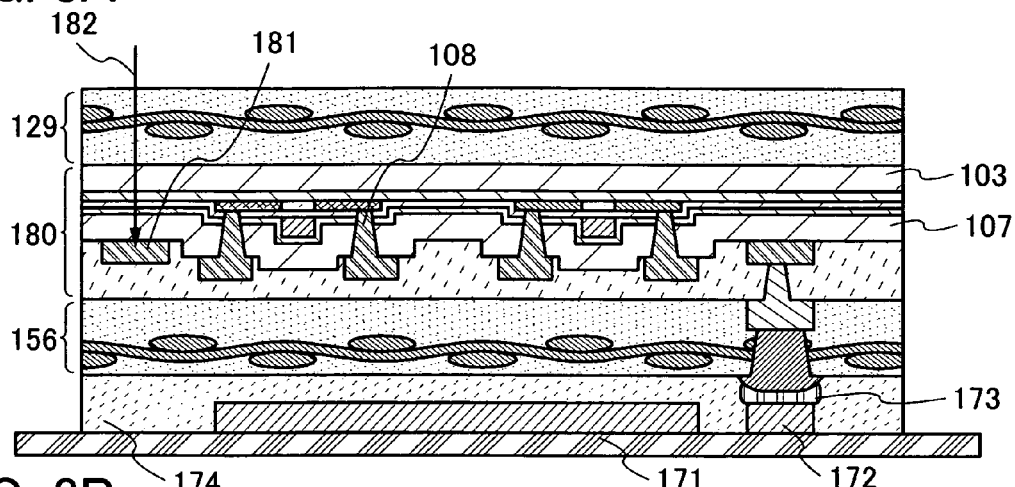
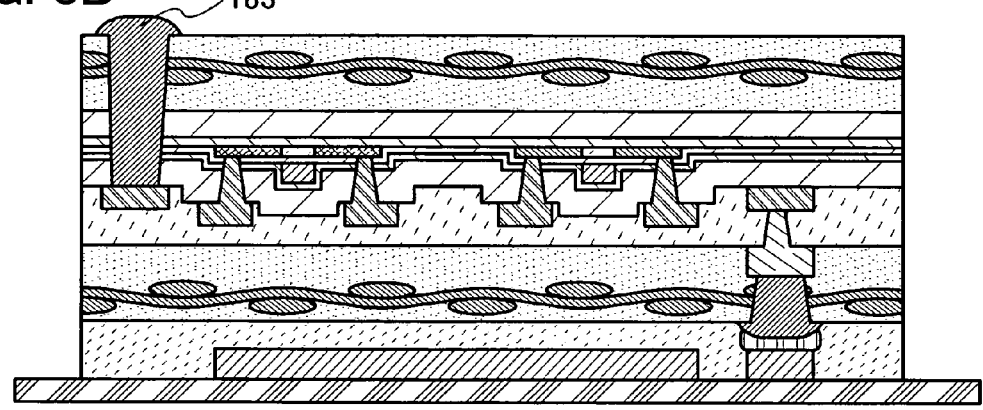
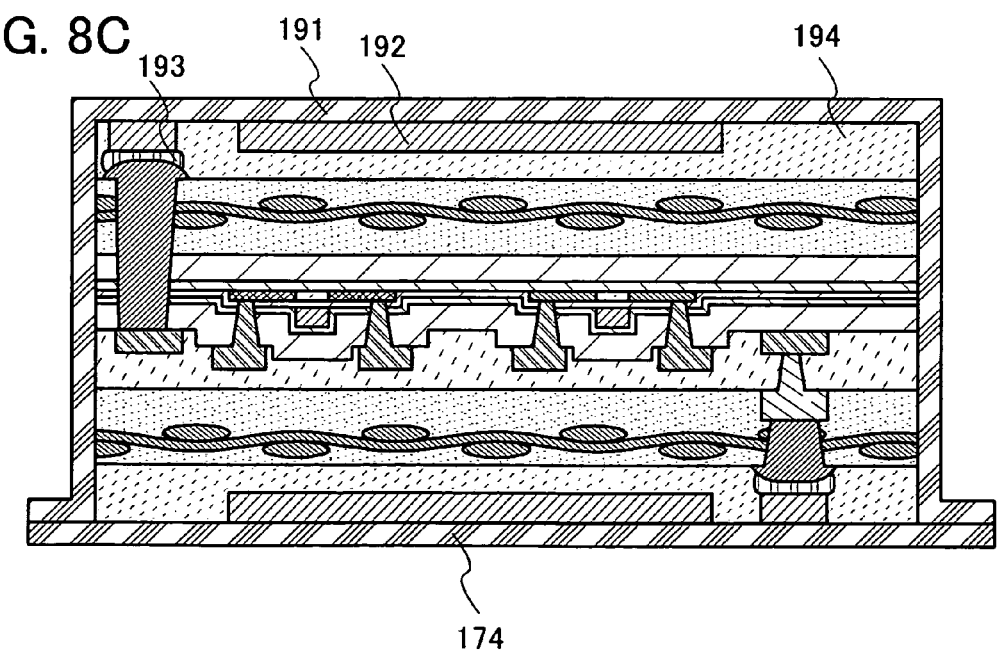

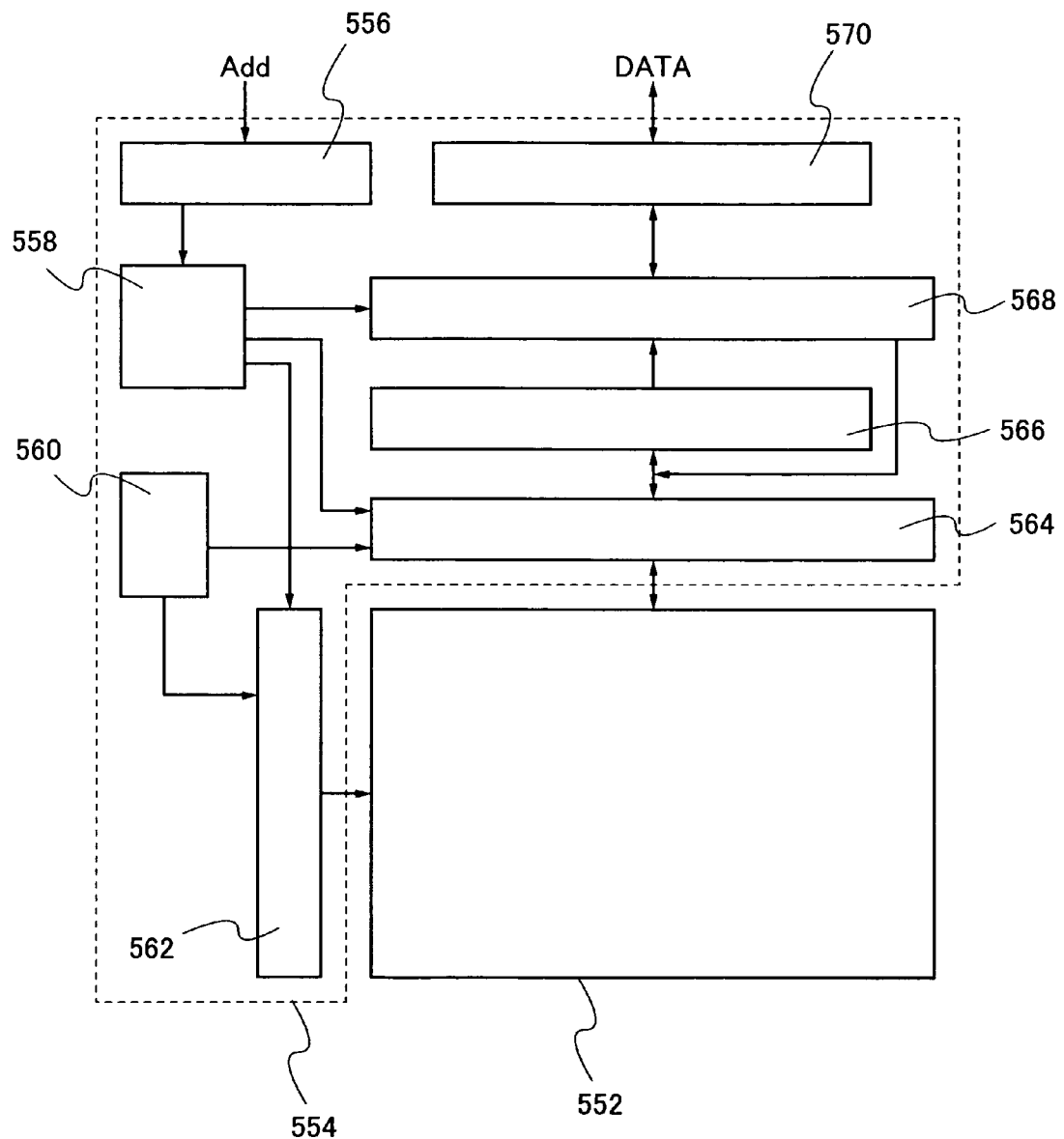

METHOD FOR MANUFACTURING SEMICONDUCTOR DEVICE

BACKGROUND OF THE INVENTION

1. Field of the Invention

The present invention relates to a method for manufacturing a semiconductor device having a semiconductor element using a non-single crystal semiconductor layer.

2. Description of the Related Art

Currently, thinning of various devices such as wireless chips and sensors is a very important factor to achieve miniaturization of products, and the thinning technique and the application range of the miniaturized products spread rapidly. Such a variety of thinned devices are flexible to some extent and thus they can be installed to an object having a curved surface.

Therefore, a technique of manufacturing a semiconductor device has been proposed, in which an element layer including a thin film transistor formed over a glass substrate is separated from the substrate and transferred to another substrate, for example, a plastic film or the like.

The present applicant has proposed the techniques of separation and transfer, which are mentioned in Reference 1 (Japanese Published Patent Application No. H8-288522) and Reference 2 (Japanese Published Patent Application No. H8-250745). In Reference 1, a technique is described in which separation is performed by removing a silicon oxide layer, which is to be a separation layer, by wet etching. In Reference 2, a technique is described in which separation is performed by removing a silicon layer, which is to be a separation layer, by dry etching.

Further, the present applicant proposed techniques of separation and transfer, which is mentioned in Reference 3 (Japanese Published Patent Application No. 2003-174153). In Reference 3, a technique is described in which a metal layer (Ti, Al, Ta, W, Mo, Cu, Cr, Nd, Fe, Ni, Co, Ru, Rh, Pd, Os, or Ir) is formed over a substrate. This reference further discloses that, in the formation of an oxide layer over the metal layer, a metal oxide layer formed of the metal layer is formed at the interface between the metal layer and the oxide layer. According to this reference, the separation in a subsequent step is performed utilizing the metal oxide layer.

In Reference 4 (Japanese Published Patent Application No. 2004-78991), a semiconductor device is disclosed in which, a semiconductor chip with the size of less than or equal to 0.5 mm is embedded in paper or a film-like medium, so that tolerance for bending and concentrated loading is improved.

SUMMARY OF THE INVENTION

However, in the case of a semiconductor device with a built-in (on-chip) antenna which is incorporated in a chip, the size of the antenna is small when the area occupied by the chip is small, leading to a problem of a short communication distance. In the case where a semiconductor device is manufactured such that an antenna provided on paper or a film medium is connected to a chip, poor connection readily occurs when the size of the chip is small.

Accordingly, it is conceivable that poor connection or reduction of a communication range can be avoided by increasing the size of a chip itself. However, when the area of a chip is increased, a semiconductor device manufactured by transferring a layer including a semiconductor element to a plastic film or the like is readily cracked by external local pressure, resulting in malfunctions. For example, when a character is written with a writing material on a plastic sheet or paper on a surface of a semiconductor device, writing pressure is applied to the semiconductor device, leading to a problem of destruction of the semiconductor device. Further, when a semiconductor device is manufactured by a roll-to-roll method, linear pressure is applied to a region interposed between rolls, which readily leads to destruction of the semiconductor device.

Accordingly, the present invention provides a method for manufacturing a highly-reliable semiconductor device, which is not damaged by external local pressure, in a high yield.

An aspect of the present invention is that a semiconductor device is manufactured by forming a separation layer over a substrate having an insulating surface; forming an element layer including a semiconductor element formed using a non-single crystal semiconductor layer, over the separation layer; providing a fibrous body formed from an organic compound or an inorganic compound over the element layer; applying a composition containing an organic resin from above the fibrous body so that the fibrous body is impregnated with the organic resin; and heating the organic resin thereby forming a sealing layer comprising the fibrous body formed from an organic compound or an inorganic compound and the organic resin, over the element layer; and separating the element layer from the separation layer.

Another aspect of the present invention is that a semiconductor device is manufactured by forming a separation layer over a substrate having an insulating surface; forming an element layer including a semiconductor element formed using a non-single crystal semiconductor layer, over the separation layer; applying a composition containing an organic resin over the element layer to form an organic resin layer; providing a fibrous body formed from an organic compound or an inorganic compound over the organic resin layer so that the fibrous body is impregnated with the organic resin; heating the organic resin thereby forming a sealing layer which comprises the organic resin and the fibrous body formed from an organic compound or an inorganic compound, over the element layer; and separating the element layer from the separation layer.

The thickness of the element layer is preferably greater than or equal to 1 μm and less than or equal to 10 μm, more preferably greater than or equal to 1 μm and less than or equal to 5 μm, and the thickness of the sealing layer is preferably greater than or equal to 10 μm and less than or equal to 100 μm. Such thickness of the element layer and the sealing layer makes it possible to manufacture a semiconductor device which can be curved.

The fibrous body is a woven fabric or a nonwoven fabric which uses high-strength fiber of an organic compound or an inorganic compound. The high-strength fiber is specifically a fiber with a high elongation modulus or fiber with a high Young's modulus.

Further, as the organic resin, a thermoplastic resin or a thermosetting resin can be used.

The use of a high-strength fiber as the fibrous body allows the pressure to be dispersed throughout the fibrous body even when local pressure is applied to a semiconductor device; accordingly, partial stretching of the semiconductor device can be prevented. Thus, destruction of a wiring, a semiconductor element, or the like which is caused by partial stretching thereof, can be prevented.

The present invention makes it possible to manufacture a highly reliable semiconductor device in high yield, which is hardly damaged by external local pressure.

BRIEF DESCRIPTION OF THE DRAWINGS

In the accompanying drawings:

FIGS. 1A to 1E are cross-sectional views illustrating a semiconductor device of the present invention;

FIGS. 8A to 8C are cross-sectional views illustrating a manufacturing method of a semiconductor device of the present invention;

FIG. 14 is a diagram illustrating a semiconductor device of the present invention;

DETAILED DESCRIPTION OF THE INVENTION

Embodiment Mode

Figure 2A:
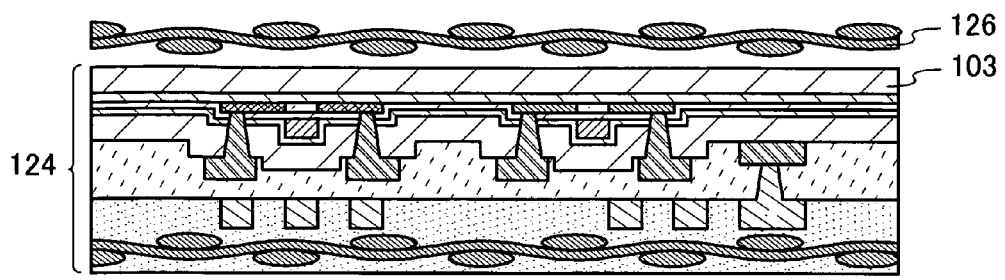
FIGS. 2A to 2C are cross-sectional views illustrating a semiconductor device of the present invention.

Embodiment Modes of the present invention will be explained below with reference to the accompanying drawings. However, the present invention can be implemented in various different modes, and it will be readily appreciated by those skilled in the art that various changes and modifications of the modes and details are possible, unless such changes and modifications depart from the content and the scope of the invention. Therefore, unless such changes and modifications depart from the scope of the invention, they should be construed as being included therein. Note that identical portions or portions having the same function in all figures for explaining embodiment modes are denoted by the same reference numerals and detailed descriptions thereof are omitted.

Embodiment Mode 1

In this embodiment mode, a method of manufacturing a semiconductor device which is not easily damaged by external local pressure in high yield will be described with reference to FIGS. 1A to 1D.

As shown in FIG. 1A, a separation layer 101 is formed over a substrate 100 having an insulating surface, and an element layer 102 formed using a semiconductor element formed from a non-single crystal semiconductor layer and an antenna 112 are formed over the separation layer 101. Next, a fibrous body 113 is provided over the element layer 102 and the antenna 112.

As the substrate 100 having an insulating surface, a substrate which can withstand a temperature at which the element layer 102 and the antenna 112 are formed is preferably used. Typically, a glass substrate, a quartz substrate, a ceramic substrate, a metal substrate in which an insulating layer is formed at least over one surface, an organic resin substrate, or the like can be used. Here, a glass substrate is used as the substrate 100 having an insulating surface. The thickness of the element layer 102 is preferably greater than or equal to 1 μm and less than or equal to 10 μm, more preferably greater than or equal to 1 μm and less than or equal to 5 μm. When the element layer 102 is formed to such a thickness, a semiconductor device capable of being curved can be manufactured.

The separation layer 101 is formed in such a manner that a layer having a thickness of 30 nm to 200 nm, which is made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing any of the elements described above as its main component; or a compound containing any of the elements described above as its main component, is formed by a sputtering method, a plasma CVD method, a coating method, a printing method, or the like to be a single layer or a laminate. The crystalline structure of a layer containing silicon may be amorphous, microcrystalline, or polycrystalline. Here, a coating method refers to a method in which a solution is discharged on an object to form a film, and includes, for example, a spin coating method and a droplet discharge method. Further, a droplet discharge method is a method in which a droplet of a composition that contains fine particles is discharged through a minute hole to form a pattern with a predetermined shape.

When the separation layer 101 has a single-layer structure, it is preferably formed of a layer containing tungsten, molybdenum, or a mixture of tungsten and molybdenum. Alternatively, the separation layer 101 is formed using a layer containing an oxide of tungsten, a layer containing an oxynitride of tungsten, a layer containing an oxide of molybdenum, a layer containing an oxynitride of molybdenum, or a layer containing an oxide or an oxynitride of a mixture of tungsten and molybdenum. It is to be noted that the mixture of tungsten and molybdenum corresponds to, for example, an alloy of tungsten and molybdenum.

In the case where the separation layer 101 has a layered structure, preferably, a metal layer is formed as a first layer, and a metal oxide layer is formed as a second layer. Typically, a layer containing tungsten, molybdenum, or a mixture of tungsten and molybdenum is formed as the metal layer of the first layer. As the second layer, a layer containing an oxide of tungsten, molybdenum, or a mixture of tungsten and molybdenum; a nitride of tungsten, molybdenum, or a mixture of tungsten and molybdenum; an oxynitride of tungsten, molybdenum, or a mixture of tungsten and molybdenum; or a nitride oxide of tungsten, molybdenum, or a mixture of tungsten and molybdenum is formed.

In the case where the separation layer 101 has a layered structure in which a metal layer is formed as the first layer and a metal oxide layer is formed as the second layer, the layered structure may be formed as follows: a layer containing tungsten is formed as the metal layer, and an insulating layer made of an oxide is formed thereover, whereby a layer containing an oxide of tungsten is formed as the metal oxide layer in the interface between the layer containing tungsten and the insulating layer. Moreover, the metal oxide layer may be formed in such a manner that the surface of the metal layer is subjected to thermal oxidation treatment, oxygen plasma treatment, treatment using a solution having strong oxidizability such as ozone-containing water, or the like.

An oxide of tungsten is represented by $WO_x$ where x is greater than or equal to 2 and less than or equal to 3. The x may be 2 ($WO_2$), 2.5 ($W_2O_5$), 2.75 ($W_4O_{11}$), 3 ($WO_3$), and the like.

Although the separation layer 101 is formed to be in contact with the substrate 100 in accordance with the above process, the present invention is not limited to the process. An insulating layer to be a base may be formed so as to be in contact with the substrate 100, and the separation layer 101 may be provided to be in contact with the insulating layer. Here, as the separation layer 101, a tungsten layer with a thickness of 30 nm to 70 nm is formed by sputtering.

As typical examples of the semiconductor element formed using a non-single crystal semiconductor layer which is included in the element layer 102, an active element such as a thin film transistor, a diode, and a nonvolatile memory element, and a passive element such as a resistor element and a capacitor element can be given. As the non-single crystal semiconductor layer, a crystalline semiconductor layer, an amorphous semiconductor layer, a microcrystalline semiconductor layer, or the like can be given. As the semiconductor, silicon, germanium, a silicon germanium compound, or the like can be given. Further, as the semiconductor, a metal oxide can be used, and typically, a zinc oxide, an oxide of zinc gallium indium, or the like can be given. Furthermore, as the semiconductor, an organic semiconductor material can be used. The thickness of the element layer 102 is preferably greater than or equal to 1 µm and less than or equal to 10 µm, more preferably greater than or equal to 1 µm and less than or equal to 5 µm. When the element layer is formed to such a thickness, a semiconductor device capable of being curved can be manufactured. The area of a top surface of the semiconductor device is preferably greater than or equal to 4 $mm^2$, more preferably greater than or equal to 9 $mm^2$.

When at least a thin film transistor, a resistor, a capacitor element, a wiring and the like are formed in the element layer 102, a microprocessor (MPU) which controls other devices and calculates and processes data can be manufactured. The MPU includes a CPU, a main memory, a controller, an interface, an I/O port, and the like.

Further, in a case where at least a memory element and a thin film transistor are formed in the element layer 102, a memory device can be manufactured as a semiconductor device. As the memory element, a nonvolatile memory element including a floating gate or a charge storage layer; a thin film transistor and a capacitor element connected to the thin film transistor; a thin film transistor and a capacitor element including a ferroelectric layer which is connected to the thin film transistor; an organic memory element in which an organic compound layer is interposed between a pair of electrodes; or the like can be given. As semiconductor devices having such memory elements, memory devices such as DRAM (Dynamic Random Access Memory), SRAM (Static Random Access Memory), FeRAM (Ferroelectric Random Access Memory), mask ROM (Read Only Memory), EPROM (Electrically Programmable Read Only Memory), EEPROM (Electrically Erasable and Programmable Read Only Memory), and flash memory can be given.

In a case where at least a diode element is formed in the element layer 102, a light sensor, an image sensing, a solar battery, or the like can be manufactured as a semiconductor device. As a diode, a PN diode, a PIN diode, an avalanche diode, or a Schottky diode, or the like which uses amorphous silicon or polysilicon can be given.

Further, in a case where at least a thin film transistor is formed in the element layer 102, and an antenna electrically connected to the thin film transistor is formed over the element layer 102, a semiconductor device, which can communicate data wirelessly, such as an ID tag, an IC tag, an RF (Radio Frequency) tag, a wireless tag, an electronic tag, an RFID (Radio Frequency Identification) tag, an IC card, an ID card, or the like (hereinafter referred to as RFID), can be manufactured. Note that a semiconductor device of the present invention includes an inlet in which an integrated circuit portion formed from a thin film transistor or the like and an antenna are sealed, or such an inlet which is formed into a seal shape or a card shape. When the area of the top face of the RFID is 4 $mm^2$ or more, further 9 $mm^2$ or more, the antenna can be formed with a large size, so that an RFID having a long communication distance with respect to a communication instrument can be manufactured.

Here, the element layer 102 including the semiconductor element formed using a non-single crystal semiconductor layer includes the following: an insulating layer 103 serving as a buffer layer; an insulating layer 104 serving as a base layer; thin film transistors 105a and 105b; an insulating layer 106 covering the thin film transistors 105a and 105b; an insulating layer 107 covering the insulating layer 106; a wiring 108 which is connected to a source region and a drain region of a semiconductor layer of the thin film transistors 105a and 105b penetrating the insulating layers 106 and 107; a wiring 109 which is connected to an antenna 112 to be formed later; and an insulating layer 111 which covers the wirings 108 and 109 and a part of the insulating layer 107. Note that the wiring 109 is electrically connected to the source or drain region of the semiconductor layer through the wiring 108.

The insulating layer 103 serving as a buffer layer is provided to facilitate separation at the interface between the separation layer 101 and the insulating layer 103 in a subsequent separation step or to prevent the semiconductor element and the wiring from being cracked or damaged in a subsequent separation step. The insulating layer 103 serving as a buffer layer is formed using an inorganic compound to be a single layer or a multilayer by a sputtering method, a plasma CVD method, a coating method, a printing method, or the like. As typical examples of the inorganic compound, a silicon oxide, a silicon nitride, a silicon oxynitride, a silicon nitride oxide, and the like can be given. When a silicon nitride, a silicon nitride oxide, a silicon oxynitride, or the like is used for the insulating layer 103 serving as a buffer layer, intrusion of moisture or gas such as oxygen from outside into the element layer to be formed later can be prevented. The thickness of the insulating layer 103 serving as a buffer layer is preferably greater than or equal to 10 nm and less than or equal to 1000 nm, more preferably greater than or equal to 100 nm and less than or equal to 700 nm. Here, a silicon oxynitride layer with a thickness of 500 nm to 700 nm is formed by plasma CVD.

The insulating layer 104 serving as a base layer can be formed using a formation method and a material which are similar to those of the insulating layer 103 serving as a buffer layer as appropriate. Further, the insulating layer 104 serving as a base layer may have a layered structure. For example, the layered structure may be formed using an inorganic compound. Typically, the insulating layer 104 may be formed by stacking a silicon oxide, a silicon nitride oxide, and a silicon oxynitride. The thickness of the insulating layer 104 serving as a base layer is preferably greater than or equal to 10 nm and less than or equal to 200 nm, more preferably greater than or equal to 50 nm and less than or equal to 150 nm. Here, a silicon nitride oxide layer with a thickness of 30 nm to 70 nm is formed by plasma CVD, and a silicon nitride oxide layer with a thickness of 80 nm to 120 nm is formed thereover by a plasma CVD method. It is to be noted that in the case where the insulating layer 103 serving as a buffer layer is provided, the insulating layer 104 serving as a base layer is not necessarily formed.

The thin film transistors 105a and 105b shown in FIG. 1A include semiconductor layers 53a and 53b each having a source region, a drain region, and a channel formation region; a gate insulating layer 54; and gate electrodes 55a and 55b.

The semiconductor layers 53a and 53b are layers formed using a non-single crystal semiconductor which has a thickness greater than or equal to 10 nm and less than or equal to 100 nm, more preferably greater than or equal to 20 nm and less than or equal to 70 nm. As the non-single crystal semiconductor layer, a crystalline semiconductor layer, an amorphous semiconductor layer, a microcrystalline semiconductor layer, or the like can be given. As the semiconductor, silicon, germanium, a compound of silicon and germanium, or the like can be given. In particular, it is preferable that the crystalline semiconductor is formed through crystallization of the amorphous semiconductor layer using rapid thermal annealing (RTA) or heat treatment using an annealing furnace, or through crystallization of the amorphous semiconductor layer using heat treatment and laser beam irradiation in combination. In the heat treatment, crystallization may be performed using a metal element such as nickel which has an effect of promoting crystallization of a silicon semiconductor.

In the case of performing crystallization by laser light irradiation in addition to heat treatment, crystallization can be performed by continuously moving a melted zone of the crystalline semiconductor, which is melted by irradiation with a continuous wave laser beam or a high-repetition-rate ultrashort pulsed laser beam having a repetition rate of 10 MHz or higher and a pulse width of 1 nanosecond or shorter, preferably in the range of 1 picosecond to 100 picoseconds inclusive, along the laser beam irradiation direction. By such a crystallization method, a crystalline semiconductor having crystal grains which have a large grain size and have a grain boundary grown in one direction can be obtained.

An impurity element such as phosphorus or boron is added to the source region and the drain region of the semiconductor layers 53a and 53b. It is preferable that phosphorus is added at an impurity concentration of $1 \times 10^{19}$ cm$^{-3}$ to $1 \times 10^{21}$ cm$^{-3}$ to a source region and a drain region of a semiconductor layer which forms an n-channel thin film transistor. Meanwhile, it is preferable that boron is added at an impurity concentration of $1 \times 10^{19}$ cm$^{-3}$ to $1 \times 10^{21}$ cm$^{-3}$ to a source region and a drain region of a semiconductor layer which forms a p-channel thin film transistor.

The gate insulating layer 54 is formed from an inorganic insulator such as a silicon oxide and a silicon oxynitride with a thickness greater than or equal to 5 nm and less than or equal to 50 nm, preferably greater than or equal to 10 nm and less than or equal to 40 nm by plasma CVD, sputtering, a coating method, a printing method, or the like.

The gate electrodes 55a and 55b can be formed using metal, or a polycrystalline semiconductor to which an impurity imparting one conductivity type is added. In the case of using metal, tungsten (W), molybdenum (Mo), titanium (Ti), tantalum (Ta), aluminum (Al), or the like can be used. A metal nitride which is obtained by nitriding metal can also be used. Alternatively, the gate electrode may have a layered structure of a first layer made of the metal nitride and a second layer made of the metal. In that case, if the first layer is formed of a metal nitride, the first layer can function as a barrier metal. In other words, the metal of the second layer can be prevented from diffusing into the gate insulating layer or the semiconductor layer below the gate insulating layer. In the case of employing a layered structure, the gate electrode may have a shape in which the edge of the first layer extends beyond the edge of the second layer.

The thin film transistors 105a and 105b which are formed by combination of the semiconductor layers 53a and 53b, the gate insulating layer 54, the gate electrodes 55a and 55b, and the like can have various structures such as a single drain structure, an LDD (Lightly Doped Drain) structure, and a gate overlapped drain structure. Here, a thin film transistor with a single drain structure is described. Alternatively, the thin film transistor can have a multigate structure which is equivalent to a plurality of transistors connected in series, to which the same gate voltage is applied, a dual gate structure where a semiconductor layer is interposed between gate electrodes, an inverted staggered structure where a gate electrode is formed over an insulating layer 56 and a gate insulating layer and a semiconductor layer are formed over the gate electrode, or the like.

As the thin film transistor, a thin film transistor using a metal oxide or an organic semiconductor material for a semiconductor layer can be formed. As typical examples of the metal oxide, a zinc oxide, an oxide of zinc gallium indium, and the like can be given.

The insulating layers 106 and 107 serve as an interlayer insulating layer which insulates the thin film transistor and the wiring. The insulating layers 106 and 107 can be formed using a formation method and a material which are similar to those of the insulating layer 103 serving as a buffer layer. Although the insulating layers 106 and 107 have a layered structure here, the insulating layers 106 and 107 may be formed in a single layer or a layered structure including two or more layers. Here, as the insulating layer 106, a silicon oxynitride layer with a thickness of 30 nm to 70 nm is formed by plasma CVD. As the insulating layer 107, a silicon nitride oxide layer with a thickness of 80 nm to 120 nm is formed by plasma CVD, and then, a silicon oxynitride layer with a thickness of 500 nm to 700 nm is formed by plasma CVD.

The wirings 108 and 109 are preferably formed using a combination of a low-resistance material such as aluminum (Al) and a barrier metal using a high-melting-point metal material such as titanium (Ti) or molybdenum (Mo), for example, a laminate of titanium (Ti) and aluminum (Al) or a laminate of molybdenum (Mo) and aluminum (Al). Here, the wirings 108 and 109 are formed in such a manner that a titanium layer with a thickness of 80 nm to 120 nm, an aluminum layer with a thickness of 250 nm to 350 nm, and a titanium layer with a thickness of 80 nm to 120 nm are stacked in this order, and then, selective etching is performed using a resist mask formed by a photolithography process.

A protective layer of a silicon nitride, a silicon nitride oxide, a silicon oxynitride, a silicon oxide, diamond-like carbon, carbon nitride, or the like may be provided over the wirings 108 and 109. If ion-assisted deposition is employed to form the protective film, a dense protective film can be obtained. With the provision of the protective layer, moisture intrusion into a thin film transistor from the outside can be prevented, and this effect is particularly enhanced by forming a dense protective film. Accordingly, the reliability of electric characteristics of the thin film transistor and the semiconductor device can be enhanced.

The insulating layer 111 is formed using a formation method and a material which are similar to those of the insulating layer 103 serving as a buffer layer. It is to be noted that the insulating layer 111 is a base layer of an antenna formed later; therefore, a surface of the insulating layer 111 is preferably flat. Accordingly, the insulating layer 111 is preferably formed by applying a composition in which an organic resin is diluted with an organic solvent and performing drying and baking thereon. Further, when the insulating layer 111 is formed using a composition in which a photosensitive resin is diluted, the number of process steps is reduced compared with a process in which etching is performed using a resist mask formed by a conventional photolithography process, leading to increase in the yield of the semiconductor device. Here, the insulating layer 111 is formed in such a manner that a composition in which a photosensitive polyimide resin is diluted with an organic solvent is applied and dried, and light exposure using a photomask is performed thereon; and then, an uncured portion is removed and baking is performed.

The antenna 112 is formed in such a manner that a droplet or paste which includes any one or more of metal particles of silver (Ag), gold (Au), copper (Cu), nickel (Ni), platinum (Pt), palladium (Pd), tantalum (Ta), molybdenum (Mo), titanium (Ti), and the like is discharged by a droplet discharge method (an ink-jet method, a dispenser method, or the like), and it is dried and baked. When the antenna is formed by a droplet discharge method, the number of process steps can be reduced, and cost can be reduced accordingly.

Further, the antenna 112 may be formed by a screen printing method. In the case of using a screen printing method, as a material for the antenna 112, a conductive paste where conductive particles having a particle size of several nanometers to several tens of micrometers is dissolved or dispersed in an organic resin is selectively printed. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersing nanoparticles of the materials described above can be used. In addition, as the organic resin included in the conductive paste, one or more selected from organic resins functioning as a binder, a solvent, a dispersive agent, and a coating member of the metal particles can be used. Typically, an organic resin such as an epoxy resin or a silicone resin can be given. Further, in forming the conductive layer, baking is preferably performed after the conductive paste is discharged.

Alternatively, the antenna 112 may be formed using gravure printing or the like instead of a screen printing method or may be formed from a conductive material by a plating method, a sputtering method, or the like.

As a signal transmission method in an RFID, an electromagnetic coupling method or an electromagnetic induction method (for example, 13.56 MHz band) is applied. In the case of utilizing electromagnetic induction caused by a change in magnetic flux density, the top view of the antenna can be a ring shape (for example, a loop antenna) or a spiral shape (for example, a spiral antenna).

Alternatively, a microwave method (for example, a UHF band (860 MHz to 960 MHz band), a 2.45 GHz band, or the like) can be employed as the signal transmission method in an RFID. In that case, the length, shape, or the like of the antenna may be appropriately set in consideration of a wavelength of an electromagnetic wave used for signal transmission.

FIGS. 16A to 16D each show an example of the antenna 112 of an RFID to which a microwave method can be adapted. For example, the top view of the antenna can be a linear shape (for example, a dipole antenna (see FIG. 16A)), a flat shape (for example, a patch antenna (see FIG. 16B)), a ribbon shape (see FIGS. 16C and 16D), or the like. Further, the shape of the conductive layer serving as an antenna is not limited to a linear shape, and may be a curved shape, a meandering shape, or a shape combining these shapes, in consideration of the wavelength of an electromagnetic wave.

The fibrous body 113 provided over one surface or opposing surfaces of the element layer 102 is a woven fabric or a nonwoven fabric which uses high-strength fiber of an organic compound or an inorganic compound, and the fibrous body 113 covers an entire surface of the element layer 102. High-strength fiber is specifically fiber with a high elongation modulus or fiber with a high Young's modulus. As typical examples of high-strength fiber, poly(vinyl alcohol) fiber, polyester fiber, polyamide fiber, polyethylene fiber, aramid fiber, polyparaphenylenebenzobisoxazole fiber, glass fiber, carbon fiber, and the like can be given. As the glass fiber, glass fiber using E glass, S glass, D glass, Q glass, or the like can be used. It is to be noted that the fibrous body 113 may be formed from one or more kinds of the above-described high-strength fiber.

The fibrous body 113 may be formed using a woven fabric which is woven using bundles of fiber (single yarn) (hereinafter, referred to as yarn bundles) for warp yarns and weft yarns, or a nonwoven fabric obtained by stacking yarn bundles of plural kinds of fiber in a random manner or in one direction. In the case of a woven fabric, a plain-woven fabric, a twilled fabric, a satin-woven fabric, or the like can be appropriately used.

The yarn bundle may have a circular shape or an elliptical shape in cross section. As the yarn bundle, a yarn bundle may be used which has been subjected to fiber opening with a high-pressure water stream, high-frequency vibration using liquid as a medium, continuous ultrasonic vibration, pressing with a roll, or the like. A yarn bundle which is subjected to fabric opening has a large width, can reduce the number of single yarns in the thickness direction, and has an elliptical shape or a flat shape in its cross section. Further, by using a loosely twisted yarn as the yarn bundle, the yarn bundle is easily flattened and has an elliptical shape or a flat shape in cross section. Use of a yarn bundle having an elliptical shape or a flat shape in cross section in this manner can reduce the thickness of the fibrous body 113. Accordingly, a thin semiconductor device can be manufactured. The effect of the present invention was observed in both cases where the width of the yarn bundle is greater than or equal to 4 µm and less than or equal to 400 µm, and greater than or equal to 4 µm and less than or equal to 200 µm. Theoretically, the width of the yarn bundle can be smaller than the width mentioned above. Furthermore, the effect of the present invention was observed when the thickness of the yarn bundle is greater than or equal to 4 µm and less than or equal to 20 µm. Theoretically, the thickness of the yarn bundle can be smaller than the thickness described above. The width and the thickness depend on a material of fiber.

In the drawings of this specification, the fibrous body 113 is shown as a woven fabric which is plain-woven using a yarn bundle having an elliptical shape in cross section. Although the size of the thin film transistors 105a and 105b is larger than that of a yarn bundle of the fibrous body 113, the size of the thin film transistors 105a and 105b may be smaller than that of a yarn bundle of the fibrous body 113.

Figure 11A:
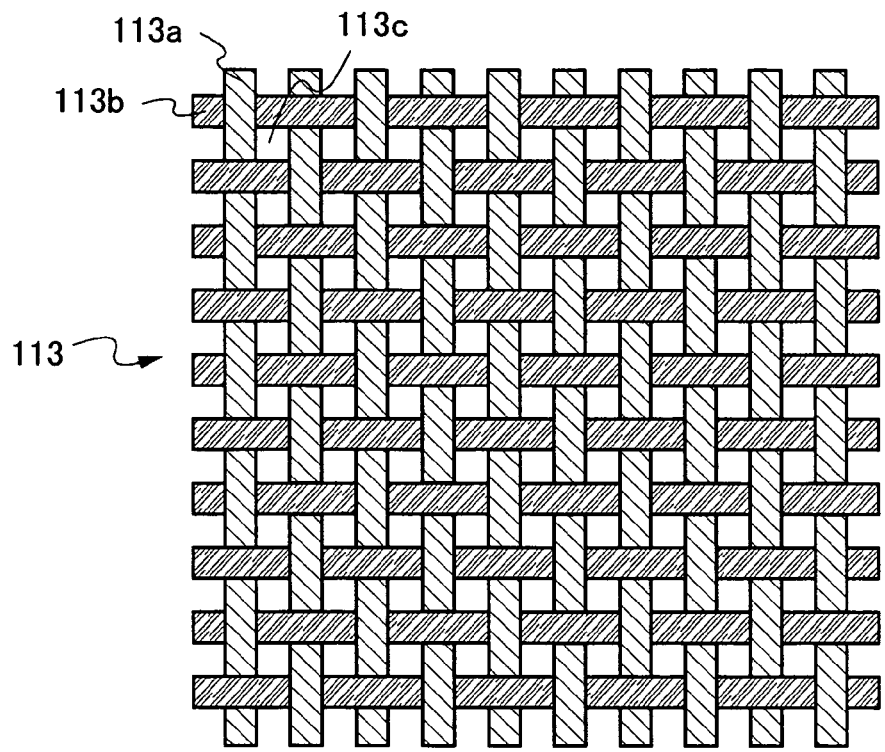
FIGS. 11A and 11B are top views each illustrating a fibrous body which can be applied to the present invention.
Figure 11B:
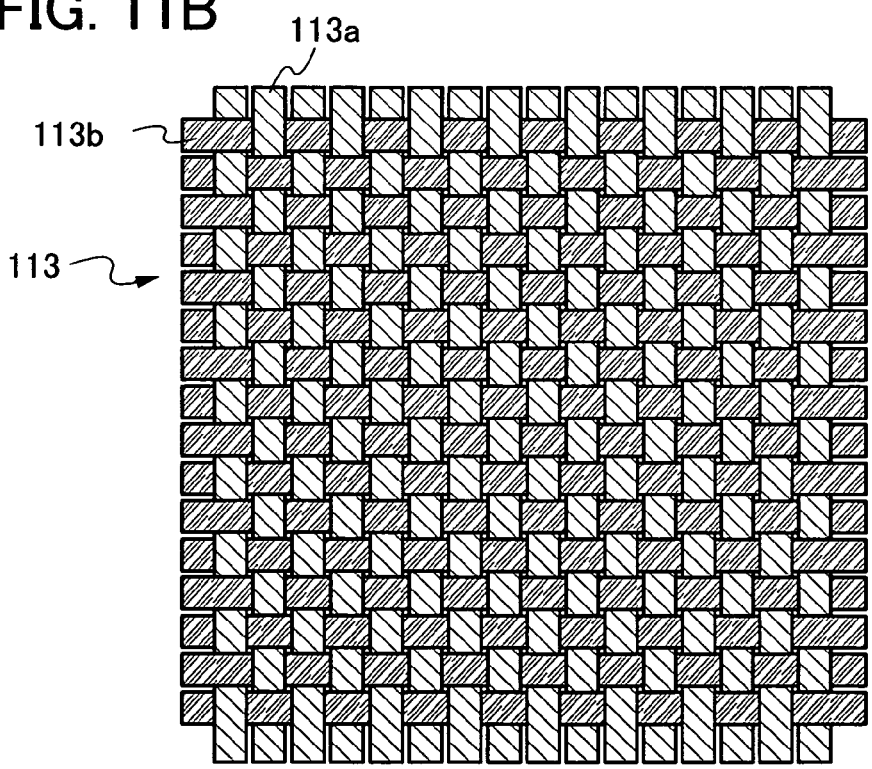

FIGS. 11A and 11B each show a top view of a woven fabric as the fibrous body 113 which is woven using yarn bundles for warp yarns and weft yarns.

As shown in FIG. 11A, the fibrous body 113 is woven using warp yarns 113a spaced at regular intervals and weft yarns 113b spaced at regular intervals. Such a fibrous body has a region without the warp yarns 113a and the weft yarns 113b (referred to as a basket hole 113c). In such a fibrous body 113, the fibrous body is further impregnated with an organic resin, whereby adhesiveness between the fibrous body 113 and the element layer 102 can be further increased.

As shown in FIG. 11B, in the fibrous body 113, density of the warp yarns 113a and the weft yarns 113b may be high and a proportion of the basket holes 113c may be low. Typically, the size of the basket hole 113c is preferably smaller than the area of a locally pressed portion. More typically, the basket hole 113c preferably has a rectangular shape having a side with a length greater than or equal to 0.01 mm and less than or equal to 0.2 mm. When the basket hole 113c of the fibrous body 113 has such a small area, even when pressure is applied by a member with a sharp tip (typically, a writing material such as a pen or a pencil), the pressure can be absorbed in the entire fibrous body 113.

Further, in order to enhance permeability of an organic resin into the inside of the yarn bundle, the fiber may be subjected to surface treatment. For example, as the surface treatment, corona discharge, plasma discharge, or the like for activating a surface of the fiber can be given. Further, surface treatment using a silane coupling agent or a titanate coupling agent can be given.

Next, as shown in FIG. 1B, an organic resin layer 114 is formed on the fibrous body 113 and the element layer. As the organic resin layer 114, a thermosetting resin such as an epoxy resin, an unsaturated polyester resin, a polyimide resin, a bismaleimide-triazine resin, or a cyanate resin can be used. Further, a thermoplastic resin such as a poly(phenylene oxide) resin, a polyetherimide resin, or a fluorine resin can be used. Furthermore, a plurality of the above-described thermosetting resin and thermoplastic resin may be used. When the above-described organic resin is used, the fibrous body can be firmly fixed to the element layer by thermal treatment. It is preferred that the organic resin has a high glass temperature because the higher the glass transition temperature of the organic resin layer 114 is, the harder the organic resin layer 114 is damaged by local pressure.

As a method for forming the organic resin layer 114, a printing method, a cast method, a droplet discharge method, a dip coating method, or the like can be used.

Here, the fibrous body 113 is impregnated with whole or a part of the organic resin layer 114. In other words, the fibrous body 113 is included in the organic resin layer 114. Thus, the adhesion between the fibrous body 113 and the organic resin layer 114 is increased.

Highly thermally-conductive filler may be dispersed in the organic resin layer 114 or the yarn bundle of the fibrous body. As the highly thermally-conductive filler, an aluminum nitride, a boron nitride, a silicon nitride, alumina, or the like can be given. As the highly thermally-conductive filler, a metal particle such as silver or copper can also be given. When the highly thermally-conductive filler is included in the organic resin or the yarn bundle, heat generated in the element layer can be easily released to the outside. Accordingly, thermal storage of the semiconductor device can be suppressed, and defects which are caused by the thermal storage of the semiconductor device can be reduced.

The organic resin layer 114 is next heated so that the organic resin layer 114 is plasticized or cured. In the case where the organic resin is an organic plastic resin, the organic resin which is plasticized by heating is then cured by cooling to room temperature.

Consequently, as shown in FIG. 1C, the organic resin layer 114 becomes an organic resin layer 121 with which the fibrous body 113 is impregnated and which is firmly fixed to one side of the element layer 102 and one side of the antenna 112. It is to be noted that the organic resin layer 121 and the fibrous body 113 which are firmly fixed to one side of the element layer 102 and one side of the antenna 112 are collectively referred to as a sealing layer 120.

Then, in order to facilitate a subsequent separation step, a groove 123 as shown in FIG. 1D may be formed by irradiating the sealing layer 120, the element layer 102, and the separation layer 101 with a laser beam from the sealing layer 120 side. As the laser beam used for forming the groove 123, a laser beam with a wavelength which is absorbed by any of layers included in the separation layer 101, the element layer 102, or the sealing layer 120 is preferably used. Typically, a laser beam in the ultraviolet region, visible region, or infrared region is appropriately selected for irradiation.

As a laser oscillator which can produce such laser beams, the following can be used: an excimer laser such as a KrF, ArF, or XeCl laser; a gas laser such as a He, He—Cd, Ar, He—Ne, HF, or $CO_2$ laser; a solid-state laser such as a crystal laser in which crystals such as YAG, $GdVO_4$, $YVO_4$, YLF, or $YAlO_3$ are doped with Cr, Nd, Er, Ho, Ce, Co, Ti, or Tm, a glass laser, or a ruby laser; or a semiconductor laser such as a GaN, GaAs, GaAlAs, or InGaAsP laser. It is to be noted that in the case of using the solid-state laser oscillator, it is preferable to use the fundamental wave to the fifth harmonic as appropriate.

As shown in FIG. 1E, by using the groove 123 as a trigger, the substrate 100 having an insulating surface over which the separation layer 101 is formed and a layer 124 including the element layer 102 are separated from each other by a physical means at the interface between the separation layer 101 and the insulating layer 103 serving as a buffer layer. The physical means refers to a dynamic means or a mechanical means; for example, a means for applying some dynamical energy (mechanical energy). Typically, the physical means is an action of applying mechanical force (e.g., a peeling process with a human hand or with a gripper, or a separation process by rotating a roller). At this time, when an adhesive sheet which can be separated by light or heat is provided over a surface of the sealing layer 120, separation can be easily performed.

Further, a liquid may be dropped into the groove 123 to allow the liquid to be infiltrated into the interface between the separation layer 101 and the insulating layer 103 serving as a buffer layer, which may be followed by the separation of the element layer 102 from the separation layer 101. In this case, a liquid may be dropped only into the groove 123, or the substrate 100 having an insulating surface, the element layer 102, the antenna 112, and the sealing layer 120 may be wholly soaked in a liquid so that the liquid may be infiltrated from the groove 123 into the interface between the separation layer 101 and the element layer 102.

In this embodiment mode, a method is employed in which a metal oxide layer is formed as a separation layer 101 in contact with the insulating layer 103 which serves as a buffer layer, and the layer 124 including the element layer 102 is separated by a physical means. However, the present invention is not limited to this method, and the following method can be employed: a light-transmitting substrate is used, an amorphous silicon layer containing hydrogen is used as the separation layer, the separation layer 101 is irradiated with a laser beam from the substrate 100 side having an insulating surface, and hydrogen included in the amorphous silicon layer is vaporized so that separation is performed between the substrate 100 having an insulating surface and the separation layer 101.

Further, a method of removing the substrate 100 by mechanical polishing, or a method of removing the substrate 100 by dissolving the substrate 100 with a solution such as hydrofluoric acid can be employed. In this case, the separation layer 101 can be omitted.

In FIG. 1D, a method can be employed in which a fluoride gas such as $NF_3$, $BrF_3$, or $ClF_3$ is introduced into the groove 123, and the separation layer 101 is removed by etching with the use of the fluoride gas so that the layer 124 including the element layer 102 is separated from the substrate 100 having an insulating surface.

Alternatively, in FIG. 1D, a method can be employed in which after a fluoride gas such as $NF_3$, $BrF_3$, or $ClF_3$ is introduced into the groove 123 and a part of the separation layer 101 is removed by etching with the use of the fluoride gas, an adhesive member is bonded to the organic resin layer 121 so that the layer 124 including the element layer 102 is separated from the substrate 100 having an insulating surface by a physical means.

In the case where a plurality of semiconductor devices are included in the element layer 102, the plurality of semiconductor devices may be obtained by dividing the element layer 102 and the sealing layers. With such a step, a plurality of semiconductor devices can be manufactured.

In the manner described above, a semiconductor device can be manufactured.

Note that in FIGS. 1A to 1E, the organic resin layer 114 is formed after the fibrous body 113 is formed on the element layer 102; alternatively, the fibrous body may be provided on the element layer 102 and the organic resin layer 114 after forming the organic resin layer 114 on the element layer 102. These steps will be described below.

Figure 3A:
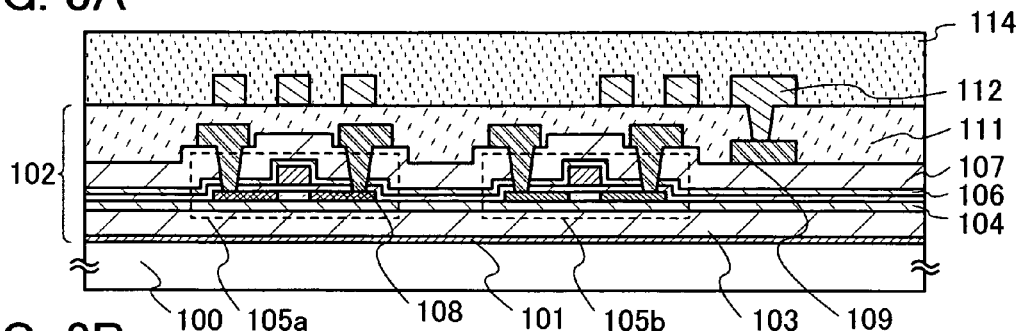
FIGS. 3A to 3D are cross-sectional views illustrating a semiconductor device of the present invention.

As shown in FIG. 3A, a separation layer 101 is formed over a substrate 100 having an insulating surface, and an element layer 102 including a semiconductor element formed using a non-single crystal semiconductor layer and an antenna 112 are formed over the separation layer 101. Then, an organic resin layer 114 is provided over the element layer 102 and the antenna 112.

Figure 3B:
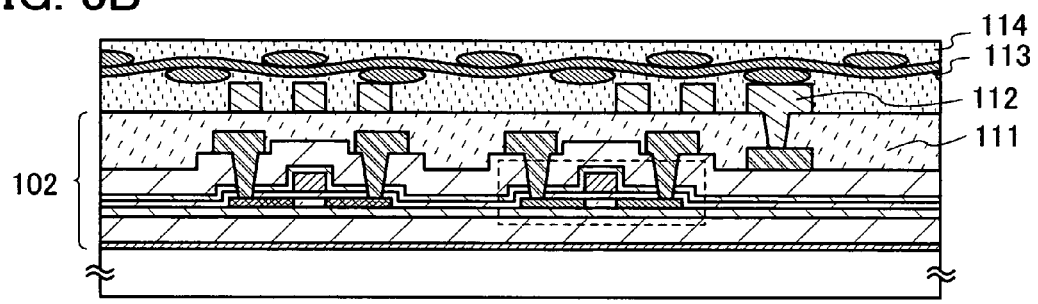

Next, as shown in FIG. 3B, the fibrous body 113 is provided over the element layer 102 and the antenna 112. Here, the fibrous body 113 is pressed against the organic resin layer 114, which allows the fibrous body 113 to be included in the organic resin layer 114. Further, the fibrous body 113 can be impregnated with the organic resin.

The organic resin layer 114 is heated so that the organic resin layer 114 is plasticized or cured. In the case where the organic resin is an organic plastic resin, the organic resin which is plasticized by heating is then cured by cooling to room temperature.

Figure 3C:
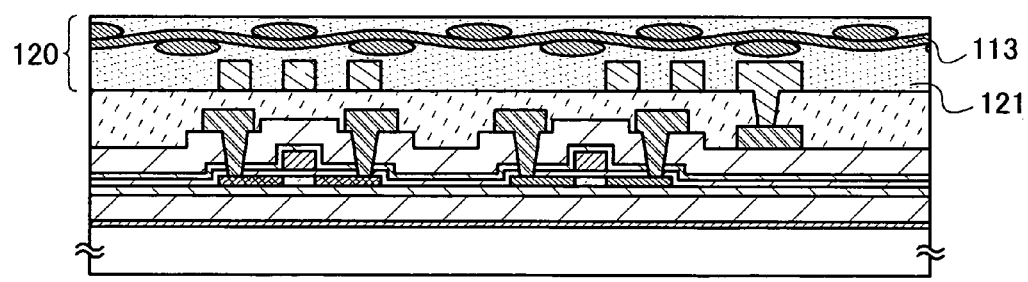

Consequently, as shown in FIG. 3C, the organic resin layer 114 becomes an organic resin layer 121 with which the fibrous body 113 is impregnated and which is firmly fixed to one side of the element layer 102 and one side of the antenna 112. It is to be noted that the organic resin layer 121 and the fibrous body 113 which are firmly fixed to one side of the element layer 102 and one side of the antenna 112 are collectively referred to as a sealing layer 120.

Figure 3D:
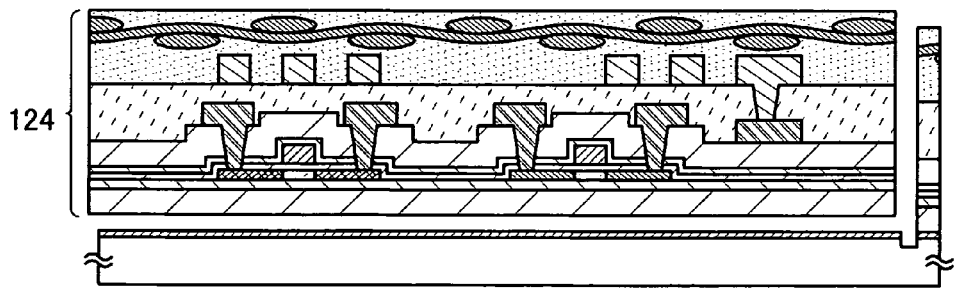

After that, as with FIG. 1D, at the interface between the separation layer 101 and the insulating layer 103 serving as a buffer layer, a layer 124 including the element layer 102 is separated as shown in FIG. 3D.

In the manner described above, a semiconductor device can be manufactured.

Note that a sealing layer may be formed on the insulating layer 103 side serving as a buffer layer. This process is explained below. As shown in FIG. 2A, a fibrous body 126 is provided over the insulating layer 103 serving as a buffer layer. The fibrous body 113 shown in FIG. 1A may be used as the fibrous body 126 as appropriate.

Figure 2B:
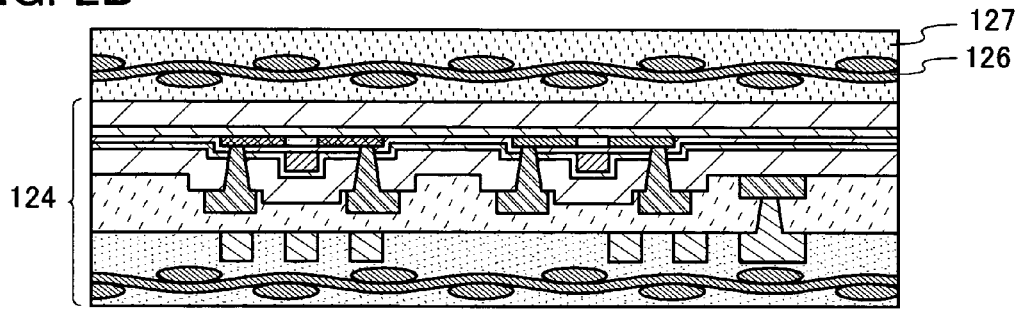

Next, as shown in FIG. 2B, a composition containing an organic resin is applied from above the fibrous body 126 and the insulating layer 103, and baking is performed to form an organic resin layer 127. The organic resin layer 114 shown in FIG. 1B may be used as the organic resin layer 127 as appropriate. Note that the organic resin layer 127 is formed such that the organic resin layer 114 includes the fibrous body 113. Further, the fibrous body 113 can be impregnated with the organic resin.

Figure 2C:
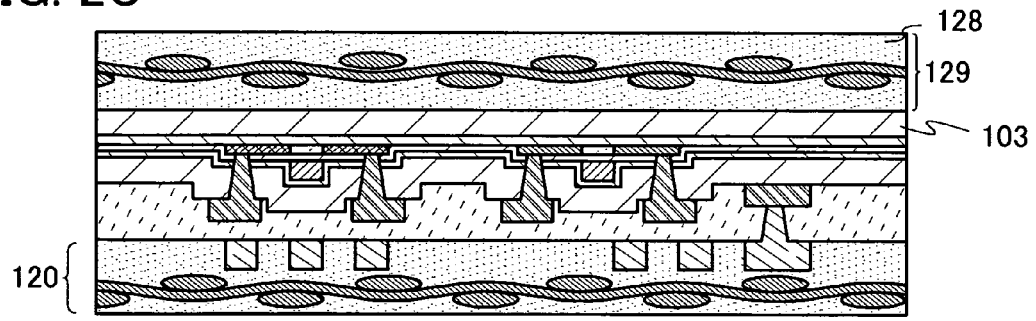

Next, as shown in FIG. 2C, the organic resin layer 127 is heated so that the organic resin of the organic resin layer 127 is plasticized or cured. After that if the organic resin is plastic, the organic resin which is plasticized by heating is also cured by being cooled to room temperature. Consequently, as shown in FIG. 2C, a sealing layer 129 is formed to have an organic resin layer 128 with which the fibrous body 113 is impregnated and which is formed over the insulating layer 103 serving as a buffer layer. Thus, a semiconductor device can be manufactured, in which both surfaces of the element layer 102 are provided with the sealing layers 120 and 129.

Here, the sealing layers 120 and 129 are preferably formed from the same fibrous body and organic resin in order to reduce warpage. However, in the case where the surface and the rear are distinguished from each other, it is not necessary that the sealing layers 120 and 129 are formed from the same materials. In such a manner, the organic resin with which the fibrous body is impregnated is firmly fixed to the both surfaces of the element layer, whereby the semiconductor device can be supported by the fibrous body. Therefore, warpage of the semiconductor device can be reduced, which facilitates mounting of the semiconductor device on a laminate film, a seal, or the like.

The direction of the warp yarn or the weft yarn of the fibrous body of the sealing layer 120 formed over the element layer 102 and the direction of the warp yarn or the weft yarn of the fibrous body of the sealing layer 129 may be shifted from each other by 30° or more and 60° or less, more preferably 40° or more and 50° or less. In this case, since stretching directions of the fibrous bodies provided on the front and the rear of the element layer are different from each other, stretching due to local pressure is isotropic. Thus, destruction of the semiconductor device by local pressure can be further reduced.

Here, an effect of the semiconductor device in this embodiment mode is described with reference to FIGS. 4A to 4D.

Figure 4A:
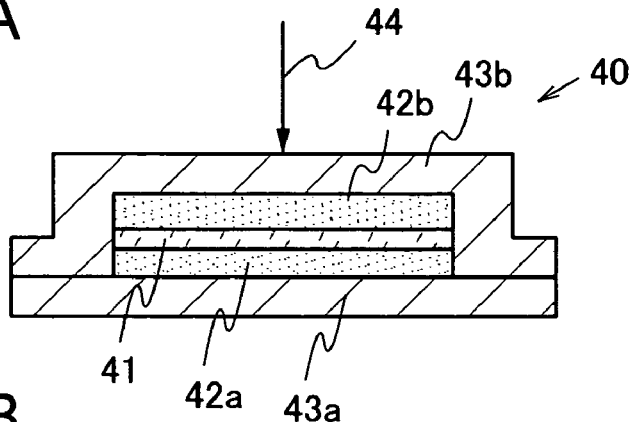
FIGS. 4A to 4D are cross-sectional views illustrating a manufacturing method of a semiconductor device of the present invention.

As shown in FIG. 4A, in a conventional semiconductor device 40, an element layer 41 including a semiconductor element formed using a non-single crystal semiconductor layer is sealed with films 43a and 43b with the use of adhesive members 42a and 42b. Local pressure 44 is applied to a semiconductor device having such a structure.

Figure 4B:
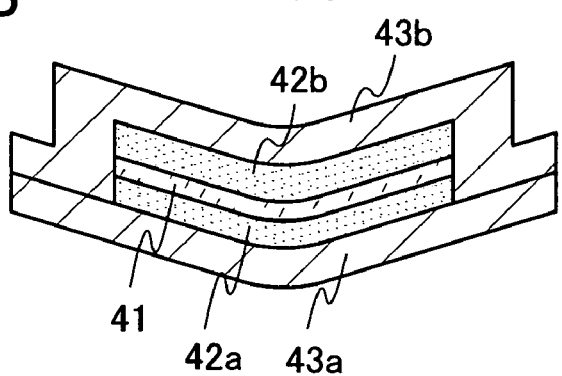

As a result, as shown in FIG. 4B, the element layer 41, the adhesive members 42a and 42b, and the films 43a and 43b are each stretched, and a curve with a small radius of curvature is generated in the pressed portion. Accordingly, the semiconductor element included in the element layer 41, a wiring, or the like are cracked, and the semiconductor device is destroyed.

Figure 4C:
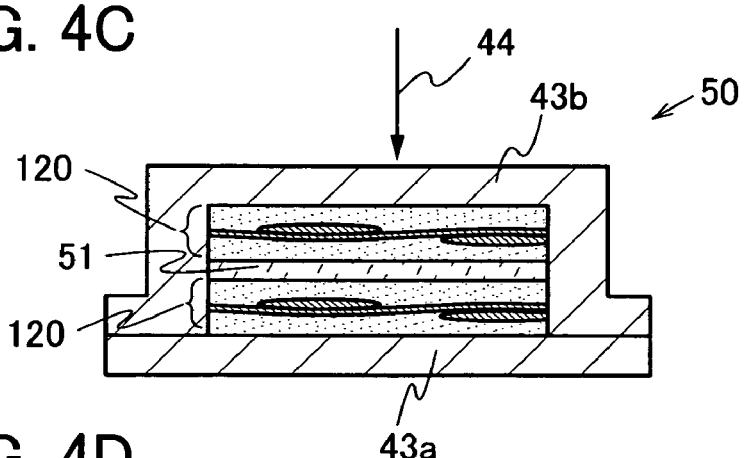
Figure 4D:
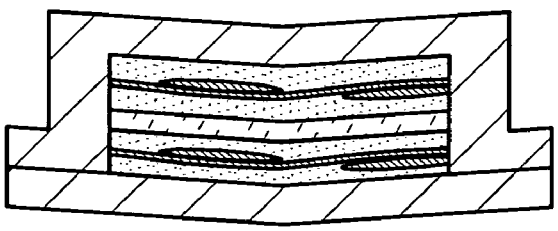

However, in a semiconductor device 50 described in this embodiment mode, as shown in FIG. 4C, a sealing layer formed of a fibrous body including an organic resin is provided on one side or both sides of an element layer 51. The fibrous body is formed from high-strength fiber, which has a high elongation modulus or a high Young's modulus. Accordingly, even when the local pressure 44 such as point pressure or linear pressure is applied, the high-strength fiber is not stretched. Pressing force is dispersed throughout the fibrous body, and the whole semiconductor device is curved. Thus, as shown in FIG. 4D, even when local pressure is applied, a curve generated in the semiconductor device has a large radius of curvature, and the semiconductor element included in the element layer 51, a wiring, and the like are not cracked, and accordingly, destruction of the semiconductor device can be reduced.

Further, when the element layer 51 is formed to have a small thickness, the semiconductor device can be curved. Accordingly, the area of the element layer 51 can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

Note that in the case where a plurality of semiconductor devices are included in the element layer 102, the plurality of semiconductor devices may be obtained by dividing the element layer 102 and the sealing layers. Through such steps, a plurality of semiconductor devices can be manufactured. In the case where the division is performed, selective division is possible by dicing, scribing, using a cutting machine having an edged tool, such as scissors or a knife, laser cutting, or the like.

Further, paper including a semiconductor device can be formed by embedding the semiconductor device. Specifically, the semiconductor device is provided on a first wet paper. A second wet paper is disposed thereon, and pressing and drying are performed. As a result, paper including a semiconductor device can be formed. After that, the paper may be cut into an appropriate size.

In a semiconductor device described in this embodiment mode, an element layer having a semiconductor element formed using a non-single crystal semiconductor layer and a fibrous body are firmly fixed together by an organic resin. In the fibrous body, pressure given by locally pressing is dispersed throughout fiber; thus, pressure is not localized. Accordingly, a wiring or a semiconductor element included in the semiconductor device are not stretched and the semiconductor device is not easily destroyed. Further, because the fibrous body formed from high-strength fiber is firmly fixed to the element layer, the element layer is not easily stretched also in a separation step. That is, stretching of the semiconductor element formed in the element layer, the wiring, or the like can be reduced, and thus, the yield of the semiconductor device can be improved.

Further, when the element layer is formed to have a small thickness, the semiconductor device can be curved. Accordingly, the area of the element layer can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

Embodiment Mode 2

This embodiment mode describes a manufacturing method of a semiconductor device which is not easily destroyed compared with Embodiment Mode 1, with reference to FIGS. 5A to 5D.

Figure 5A:
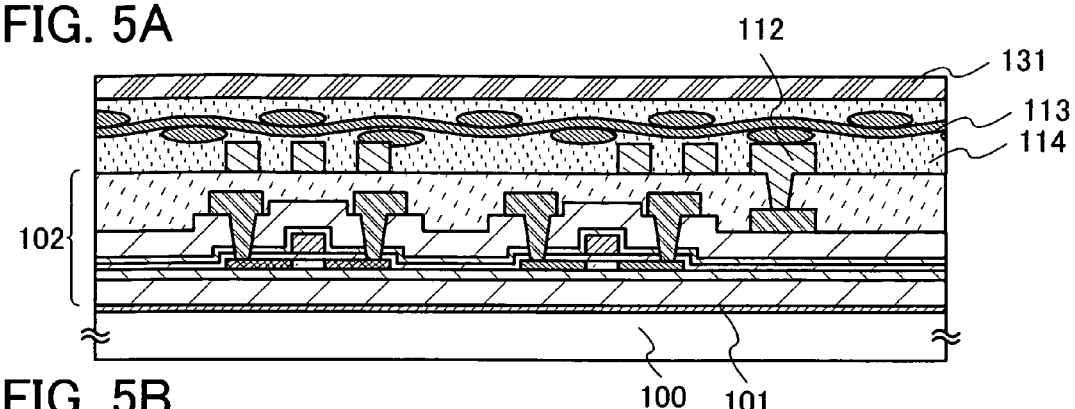
FIGS. 5A to 5D are cross-sectional views illustrating a manufacturing method of a semiconductor device of the present invention.

In a similar manner to Embodiment Mode 1, as shown in FIG. 5A, a separation layer 101 is formed over a substrate 100 having an insulating surface, and an element layer 102 including a semiconductor element formed using a non-single crystal semiconductor layer and an antenna 112 are formed over the separation layer 101. Then, a fibrous body 113 is provided over the element layer 102 and the antenna 112, and an organic resin layer 114 is formed, which is followed by the formation of a protective film 131 over the organic resin layer 114.

The protective film 131 is preferably formed from a high-strength material. As typical examples of a high-strength material, a poly(vinyl alcohol) resin, a polyester resin, a polyamide resin, a polyethylene resin, an aramid resin, a polyparaphenylenebenzobisoxazole resin, a glass resin, and the like can be given.

Since the protective film 131 is formed from a high-strength material, destruction by local pressure can be suppressed compared with Embodiment Mode 1. In specific, in the case where the area of a basket hole, in which a warp yarn bundle and a weft yarn bundle are not distributed in a fibrous body 113, is larger than the area to which local pressure is applied, local load on the basket hole inhibits the fibrous body 113 from absorbing the pressure, which results in direct application of the pressure to the element layer 102 and the antenna 112. As a result, the element layer 102 and the antenna 112 are stretched, and the semiconductor element or the wiring is destroyed.

However, when the protective film 131 formed from a high-strength material is provided over the organic resin layer 114, a local load is absorbed in the entire protective film 131, leading to a semiconductor device which is not easily destroyed by local pressure.

Figure 5B:
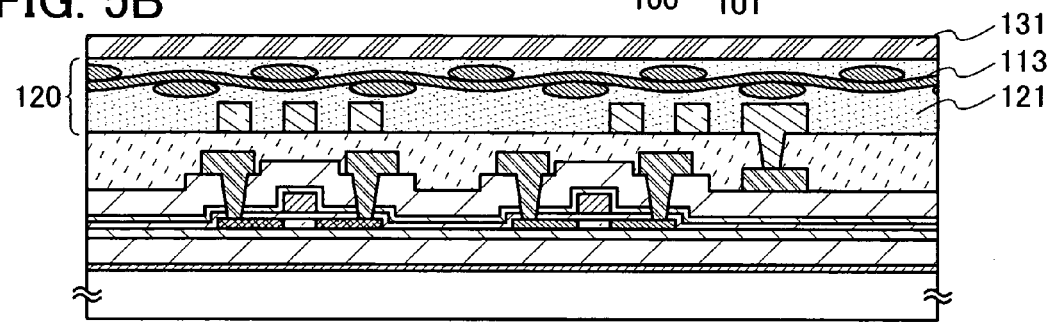

As shown in FIG. 5B, in a similar manner to Embodiment Mode 1, the organic resin layer 114 is heated, so that a sealing layer 120 is formed. The protective film 131 is firmly fixed to the element layer 102 and the antenna 112 by an organic resin of the sealing layer 120. That is, the fibrous body 113 and the protective film 131 are firmly fixed to the element layer 102 and the antenna 112 by the sealing layer 120. The fibrous body 113 is impregnated with the organic resin layer 121 included in the sealing layer 120.

Figure 5C:
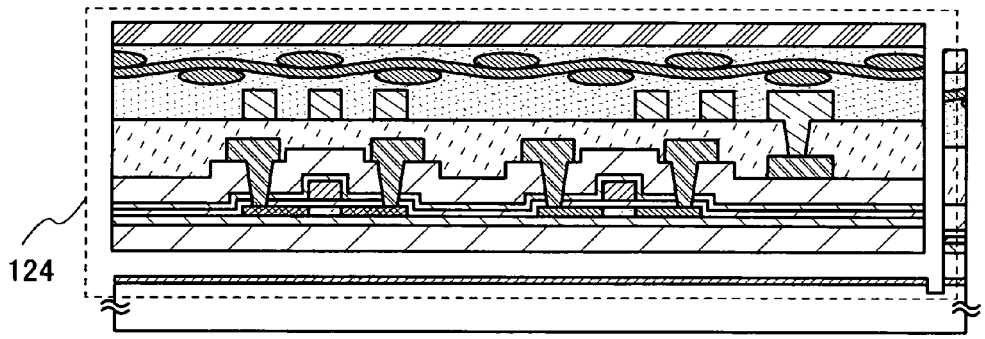

As shown in FIG. 5C, a layer 124 containing the element layer 102 is separated from the substrate 100 having an insulating surface over which the separation layer 101 is formed. Here, in a similar manner to Embodiment Mode 1, after the element layer 102 and the separation layer 101 are irradiated with a laser beam and the groove is formed, separation is performed by a physical means within a metal oxide layer formed at the interface between the separation layer 101 and the insulating layer 103 serving as a buffer layer.

Figure 5D:
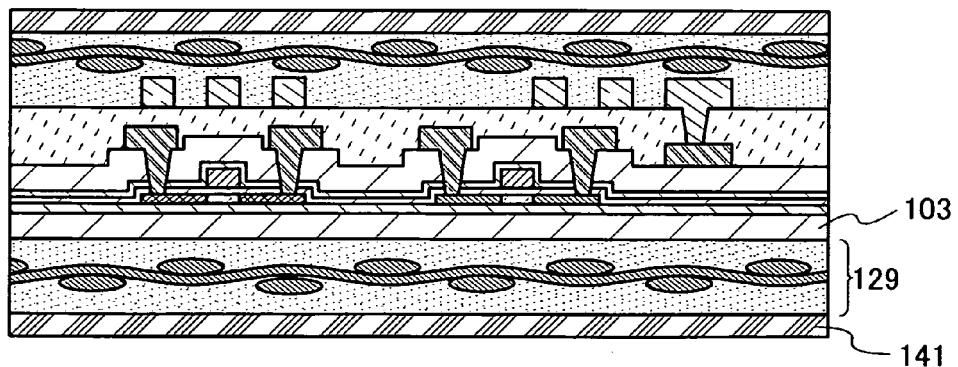

After that, as shown in FIG. 5D, a fibrous body is provided over a surface of the insulating layer 103 serving as a buffer layer, an organic resin layer is formed, a protective film 141 is formed over the organic resin layer, and heating and pressure bonding are performed, so that a sealing layer 129 and a protective film 141 are firmly fixed to the element layer 102.

In FIG. 5A, in the case where the protective film 131 is a thermoplastic material, the protective film 131 may alternatively be provided between the element layer 102 and the antenna 112, and the fibrous body 113, and heating and pressure bonding may be performed. Further, thermocompression bonding may be performed after the protective film 131 is provided between the organic resin layer 114, the element layer 102, and the antenna 112, and the fibrous body 113. In FIG. 5D, in the case where the protective film 141 is a thermoplastic material, the protective film 141 may be provided between the insulating layer 103 serving as a buffer layer and the fibrous body, and heating and pressure bonding may be performed. Moreover, thermocompression bonding may be performed after the protective film 141 is provided between the insulating layer 103 serving as a buffer layer and the fibrous body. Also in this structure, a load given by locally pressing can be dispersed in the protective film and the fibrous body, and accordingly, destruction of the semiconductor device can be reduced.

In the case where a plurality of semiconductor devices are included in the element layer 102, the plurality of semiconductor devices may be obtained by dividing the element layer 102 and the sealing layers. With such a step, a plurality of semiconductor devices can be manufactured.

Further, as in Embodiment Mode 1, a semiconductor device is embedded in paper; thus, paper including a semiconductor device can be formed.

In a manner described above, a semiconductor device which is not easily destroyed by local pressure can be manufactured. Further, when the element layer is formed to have a small thickness, the semiconductor device can be curved. Accordingly, the area of the element layer can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

Embodiment Mode 3

This embodiment mode describes a method for manufacturing a semiconductor device in which an antenna is not formed in an element layer and an antenna provided over another substrate is connected to the element layer, with reference to FIGS. 6A to 6C and FIGS. 7A to 7C.

Figure 6A:
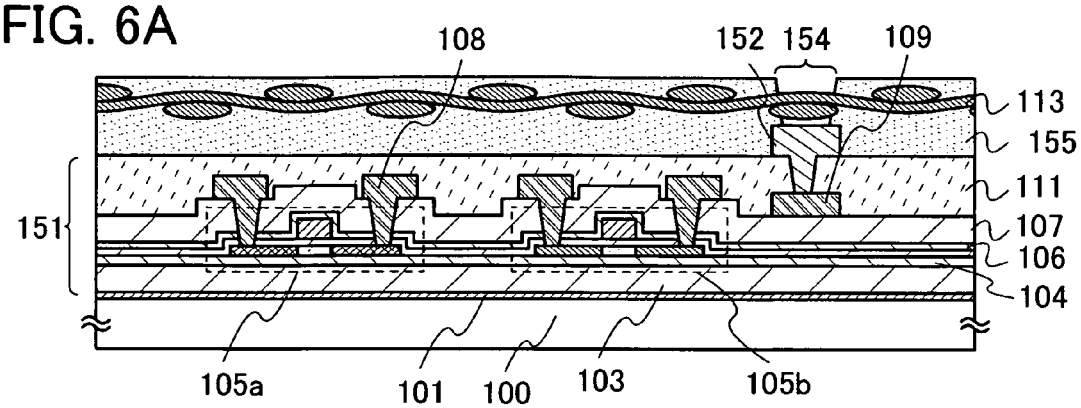
FIGS. 6A to 6C are cross-sectional views illustrating a manufacturing method of a semiconductor device of the present invention.

As shown in FIG. 6A, in a similar manner to Embodiment Mode 1, a separation layer 101 is formed over a substrate 100 having an insulating surface, and an element layer 151 including a semiconductor element formed using a non-single crystal semiconductor layer is formed over the separation layer 101. Then, an organic resin layer 155 having the fibrous body and an opening 154 is provided over the element layer 151.

Here, as the element layer 151, as described in Embodiment Mode 1, an insulating layer 103 serving as a buffer layer is formed, an insulating layer 104 serving as a base layer is formed over the insulating layer 103 serving as a buffer layer, and thin film transistors 105a and 105b are formed over the insulating layer 104. Insulating layers 106 and 107 are formed over the thin film transistors 105a and 105b, and a wiring 108 which is connected to a source region and a drain region of a semiconductor layer of the thin film transistors 105a and 105b penetrating the insulating layers 106 and 107 and a wiring 109 which is connected to an electrode pad 152 to be formed later formed. Note that the electrode pad 152 is electrically connected to the source or drain regions of the semiconductor layer through the wiring 109 and 108. An insulating layer 111 is formed over the wirings 108 and 109 and the insulating layer 107, and an electrode pad 152 which is connected to the wiring 109 penetrating the insulating layer 111 is formed.

The organic resin layer 155 is formed so as to have an opening 154 in which part of the electrode pad 152 is exposed, by providing a composition in which an organic resin is diluted with an organic solvent over the element layer 151 by a printing method or a droplet discharge method and performing drying by baking.

Figure 6B:
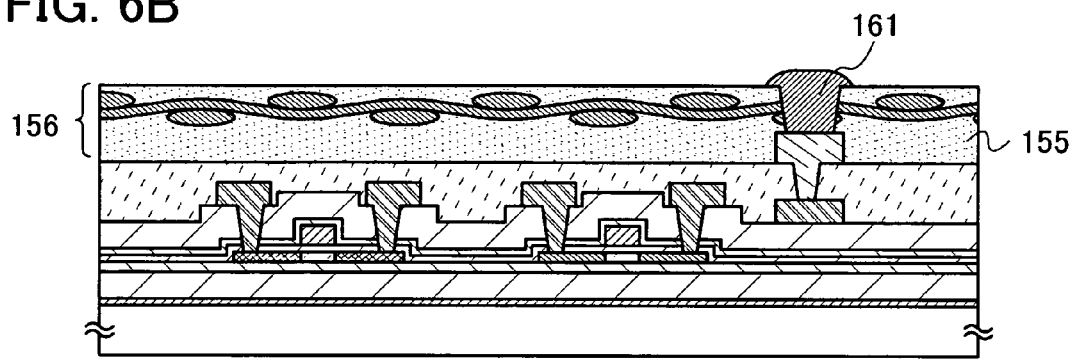

As shown in FIG. 6B, a connection terminal 161 is formed in an opening in the organic resin layer 155. The connection terminal 161 can be formed by a printing method, a droplet discharge method, or the like. As a material for the connection terminal 161, at least one of metal particles of silver (Ag), gold (Ag), copper (Cu), nickel (Ni), platinum (Pt), palladium (Pd), tantalum (Ta), molybdenum (Mo), and titanium (Ti); fine particles of silver halide; or dispersive nanoparticles of the above-mentioned materials can be used. Next, the materials of the organic resin layer 155 and the connection terminal 161 are baked to form a sealing layer 156 including the organic resin layer 155 and the fibrous body 113 on one side surface of the element layer 151. Note that the sealing layer 156 is provided with the connection terminal 161 which connects to the electrode pad 152.

Figure 6C:
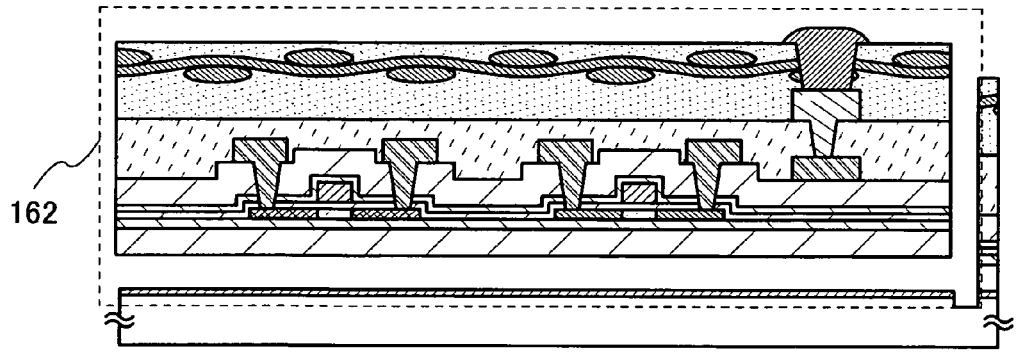

Next, as shown in FIG. 6C, the substrate 100 having an insulating substrate, over which the separation layer 101 is formed, and a layer 162 including the element layer 151 are separated from each other. Here, in a similar manner to Embodiment Mode 1, the element layer and the separation layer 101 are irradiated with a laser beam, so that a groove is formed. After liquid is supplied to the groove, separation is performed by a physical means at the interface between the separation layer 101 and the insulating layer 103 serving as a buffer layer.

Figure 7A:
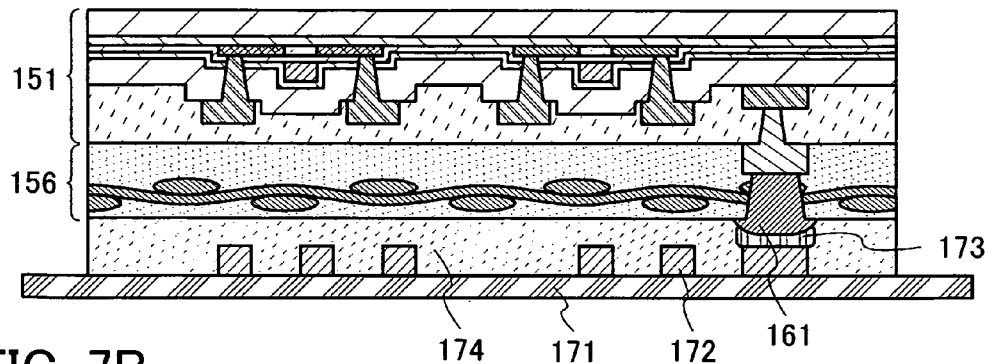
FIGS. 7A to 7C are cross-sectional views illustrating a manufacturing method of a semiconductor device of the present invention.

Then, as shown in FIG. 7A, the sealing layer 156 which is firmly fixed to the element layer 151 and a substrate 171 over which an antenna 172 is formed are bonded together by an adhesive member 174. At this time, the connection terminal 161 which is formed on the element layer 151 and the antenna 172 are electrically connected to each other by an anisotropic conductive adhesive member 173.

As the anisotropic conductive adhesive member 173, an adhesive resin containing conductive particles (each grain size is several nanometers to several tens of micrometers), which are dispersed, such as an epoxy resin or a phenol resin can be given. The conductive particle is formed from one or more elements selected from gold, silver, copper, palladium, nickel, carbon, and platinum. Further, a particle having a multilayer structure of these elements may be used. Furthermore, a conductive particle in which a thin film formed from one or more elements selected from gold, silver, copper, palladium, nickel, and platinum is formed over a surface of a particle formed from a resin may be used. Further alternatively, a CNT (carbon nanotube) may be used as the conductive particle.

The antenna 172 can be appropriately formed using a material and a formation method which are similar to those of the antenna 112 described in Embodiment Mode 1.

As the substrate 171 over which the antenna 172 is formed, a plastic film substrate, for example, a plastic substrate of poly(ethylene terephthalate) (PET), a poly(ether sulfone) (PES), poly(ethylene naphthalate) (PEN), a polycarbonate (PC), nylon, a poly(ether ether ketone) (PEEK), a polysulfone (PSF), a poly(ether imide) (PEI), a polyarylate (PAR), poly (butylene terephthalate) (PBT), or the like can be used.

Figure 7B:
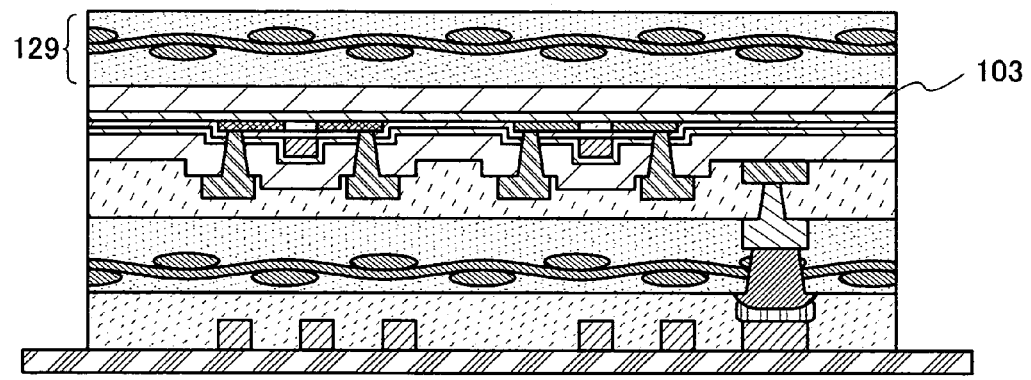

Then, as shown in FIG. 7B, in a similar manner to Embodiment Mode 1, a sealing layer 129 may be provided over a surface of the insulating layer 103 serving as a buffer layer.

Figure 7C:
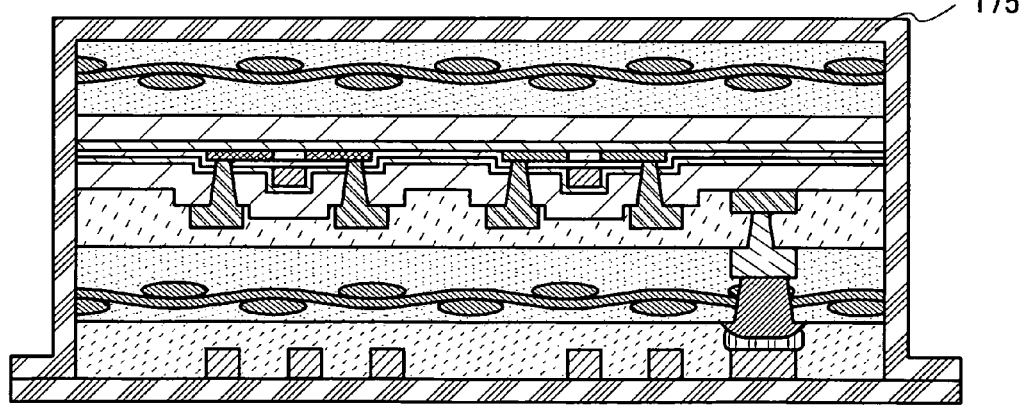

Then, as shown in FIG. 7C, a film 175 may be provided so as to seal the substrate 171 over which the antenna 172 is formed, the sealing layer 156, the element layer 151, and the sealing layer 129. The film can be a film similar to that of the substrate 171 over which the antenna 172 is formed.

This embodiment mode describes a mode in which, after the element layer 151 is separated from the separation layer 101, the substrate 171 over which the antenna 172 is formed is bonded to the sealing layer 156 on the element layer 151. Alternatively, as shown in FIG. 6B, after the connection terminal 161 is formed, the sealing layer 156 and the substrate 171 over which the antenna 172 may be formed are bonded together, and the antenna 172 and the connection terminal 161 are electrically connected to each other by an anisotropic conductive adhesive member 173; then, the element layer 151 may be separated from the separation layer 101. Further, as shown in FIG. 7B, the sealing layer 129 may be formed over the insulating layer 103 serving as a buffer layer, and as shown in FIG. 7C, the substrate 171 over which the antenna 172 is formed, the sealing layer 156, the element layer 151, and the sealing layer 129 may be sealed with the film 175.

The above mode describes a semiconductor device in which the substrate 171 having the antenna 172 is bonded to only one surface of the element layer 151; however, the substrates over each of which the antenna is formed may be bonded to both surfaces of the element layer 151. The mode is described with reference to FIGS. 8A to 8C.

Through the steps shown in FIGS. 6A to 6C and FIG. 7A, the substrate 171 over which the antenna 172 is formed and the sealing layer 156 provided on one surface of the element layer 180 are bonded together by the adhesive member 174 as shown in FIG. 8A.

The opposite surface of the element layer 180 (that is, a surface of the insulating layer 103) is provided with the sealing layer 129. In the element layer 180, a wiring 181 which is formed in a similar manner to the wiring 108 connected to source regions and drain regions of semiconductor layers of the thin film transistors 105a and 105b is formed over the insulating layer 107. As the wiring 181, a wiring may be formed at the same time as gate electrodes 55a and 55b over the gate insulating layer.

In order to form a connection terminal which is connected to the wiring 181, an opening is formed in part of the sealing layer 129 and the element layer 180. Here, the opening is formed by irradiating the wiring 181 with a laser beam from the sealing layer 129 side, and part of the wiring 181 is exposed.

Then, as shown in FIG. 8B, a connection terminal 183 is formed so as to fill the opening. The connection terminal 183 can be formed in a similar manner to the connection terminal 161.

As shown in FIG. 8C, the sealing layer 129 and a substrate 191 provided with an antenna 192 are bonded together by using an adhesive member 194, and the connection terminal 183 and the antenna 192 are electrically connected to each other by an anisotropic conductive adhesive member 193.

In the manner described above, a semiconductor device in which both surfaces of the element layer are provided with antennas can be manufactured. Such a semiconductor device is preferably applied to a semiconductor device having a symmetrical antenna, such as an RFID capable of receiving an electric wave of a UHF band, because the size of the semiconductor device can be reduced.

In the case where a plurality of semiconductor devices are included in each of the element layers 151 and 180, the plurality of semiconductor devices may be obtained by dividing the element layers 151 and 180 and the sealing layers. With such a step, a plurality of semiconductor devices can be manufactured.

Further, as in Embodiment Mode 1, a semiconductor device is embedded in paper; thus, paper including a semiconductor device can be formed.

In a semiconductor device described in this embodiment mode, an element layer having a semiconductor element formed using a non-single crystal semiconductor layer and a fibrous body are firmly fixed together by an organic resin. In the fibrous body, pressure given by locally pressing is dispersed throughout fiber; thus, pressure is not localized. Accordingly, a wiring or a semiconductor element included in the semiconductor device are not stretched and the semiconductor device is not easily destroyed. Further, because the fibrous body formed from high-strength fiber is firmly fixed to the element layer, the element layer is not easily stretched also in a separation step. That is, stretching of the semiconductor element formed in the element layer, the wiring, or the like can be reduced, and thus, the yield of the semiconductor device can be improved.

Further, when the element layer is formed to have a small thickness, the semiconductor device can be curved. Accordingly, the area of the element layer can be enlarged, and thus, steps of manufacturing the semiconductor device can be easily performed because a connection area for connecting an external antenna to the element layer can be enlarged. In the case where the semiconductor device is an RFID with a built-in antenna, the size of the antenna can be increased. Thus, an RFID with a long communication distance can be manufactured.

Embodiment Mode 4

Figure 9A:
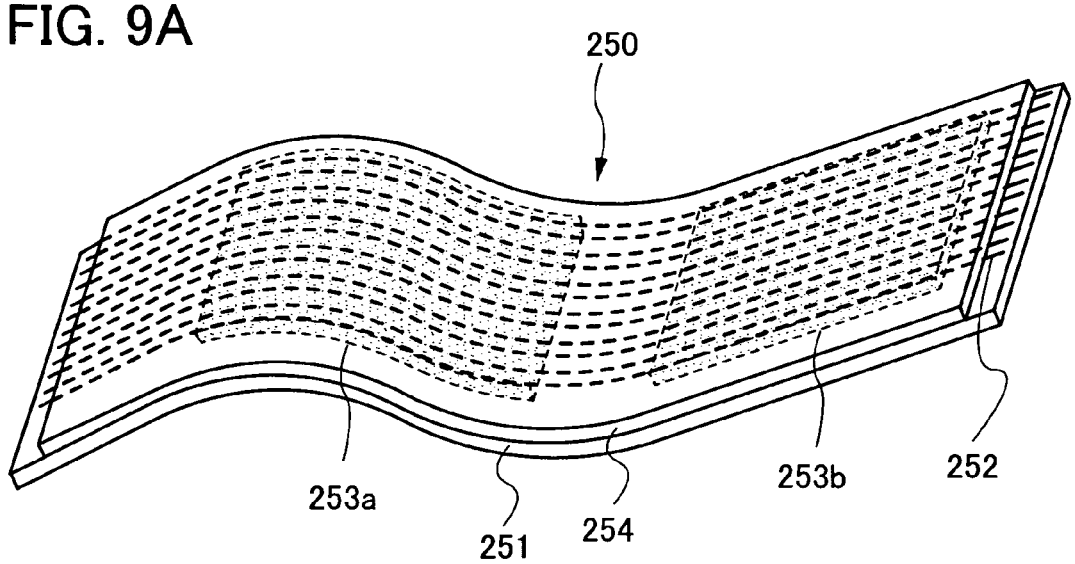
FIGS. 9A and 9B are a perspective view and a cross-sectional view, respectively, which illustrate a semiconductor device of the present invention.
Figure 9B:
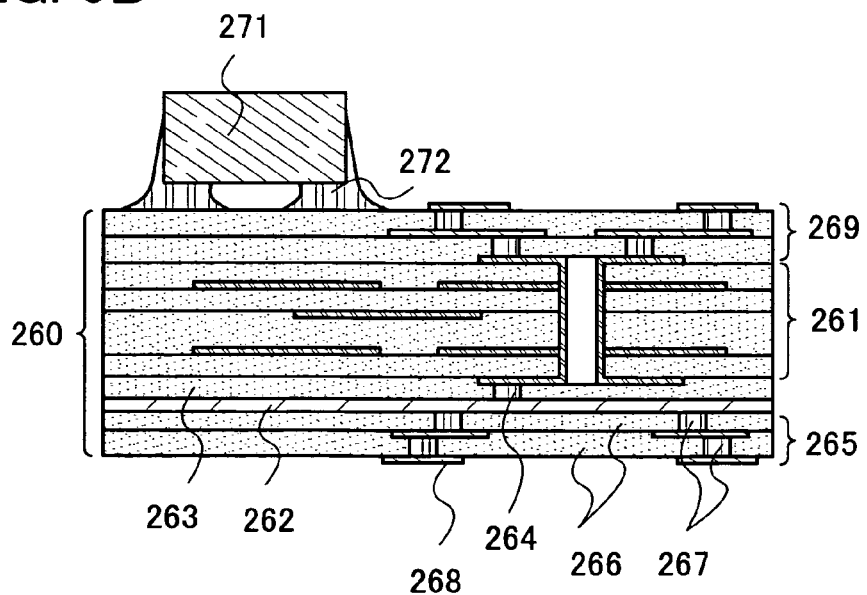

This embodiment mode describes a semiconductor device in which any of the element layers, which are described in Embodiment Modes 1 to 3, including a semiconductor element formed using a non-single crystal semiconductor layer is connected to a printed board, with reference to FIGS. 9A and 9B.

FIG. 9A is a perspective view of a semiconductor device 250 of this embodiment mode. In the semiconductor device 250, an element layer including a semiconductor element formed using a non-single crystal semiconductor layer, which is described in Embodiment Modes 1 to 3, is provided for a flexible printed board. For example, a wiring 252 formed from copper, gold, silver, aluminum, or the like is provided over a base film 251 formed from a polyester, a polyimide, or the like. Stacks 253a and 253b, in which the element layer including a semiconductor element described in Embodiment Modes 1 to 3 and a sealing layer are stacked, are provided over the wiring 252 with an insulating layer interposed between the wiring 252 and the stacks 253a and 253b. The wiring 252 is connected to the stacks 253a and 253b through a connection terminal formed in a contact hole of the sealing layer. Part of the base film 251, part of the wiring 252, and the stacks 253a and 253b are covered with a protective film 254. In an edge portion of the semiconductor device 250, part of the protective film 254 is removed and an external circuit such as a connector and the wiring 252 are exposed.

The element layer is provided for the wiring with the sealing layer interposed therebetween, and the element layer can be firmly fixed to the wiring and a base substrate by heating and pressure bonding.

Here, a semiconductor device having the wiring 252 of one layer is described below. Alternatively, a multilayer wiring structure may be employed. Further, a plurality of wirings may interpose the stacks 253a and 253b. Such a multilayer wiring can increase packing density.

FIG. 9B is a cross-sectional view of a semiconductor device 260 of this embodiment mode. In the semiconductor device 260, an element layer including a semiconductor element described in Embodiment Modes 1 to 3 is provided on a printed board. For example, an element layer 262 including a semiconductor element described in Embodiment Modes 1 to 3 is provided over one surface of a core layer 261. A wiring or a semiconductor element described in Embodiment Modes 1 to 3 is connected to the core layer 261 by a via 264 passing through a sealing layer 263.

A multilayer wiring 265 is provided on the element layer 262. The core layer 261, and the semiconductor element, the wiring, and the like which are formed in the element layer 262 are connected to a conductive pattern 268 formed on a surface of the semiconductor device 260, by vias 267 formed in organic resin layers 266 of the multilayer wiring 265.

A multilayer wiring 269 is provided on the opposite surface of the core layer 261.

In addition, a chip 271 such as a capacitor, a coil, a resistor, or a diode may be mounted over the semiconductor device 260 with the use of a mounting member 272 such as a conductive paste or a wire.

In the semiconductor device of this embodiment mode, a printed board has a layer including a semiconductor element formed using a non-single crystal semiconductor layer. Further, the element layer is provided in a printed board with the use of a prepreg using a fibrous body. Thus, even when a local load (point pressure, linear pressure, or the like) is applied, pressure is dispersed in the fibrous body, and destruction in a mounting step or caused by a curve can be reduced. Furthermore, high integration is possible.

Embodiment Mode 5

This embodiment mode describes an example of manufacturing a substrate having a conductive layer which can reduce destruction caused by a local load (point pressure, linear pressure, and the like).

Here, a manufacturing method is described below in which a substrate having an antenna is used as an example for a substrate having a conductive layer.

Figure 10A:
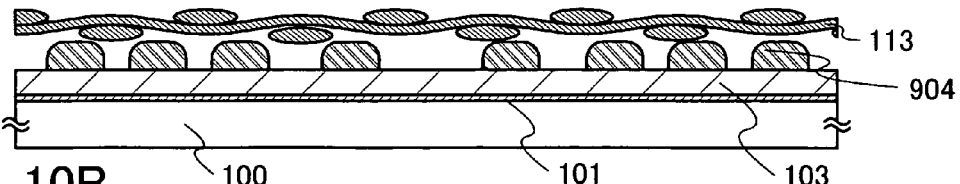
FIGS. 10A to 10F are cross-sectional views and a perspective view which illustrate a manufacturing method of a semiconductor device of the present invention.

First, in a similar manner to Embodiment Mode 1, as shown in FIG. 10A, a separation layer 101 is formed over a substrate 100 having an insulating surface, an insulating layer 103 serving as a buffer layer is formed over the separation layer 101, and a conductive layer 904 serving as an antenna is formed over the insulating layer 103.

The conductive layer 904 serving as an antenna can be appropriately formed using a formation method and a material which are similar to those of the antenna 112 described in Embodiment Mode 1.

Then, in a similar manner to Embodiment Modes 1 to 3, a fibrous body 113 is provided over the conductive layer 904.

Figure 10B:
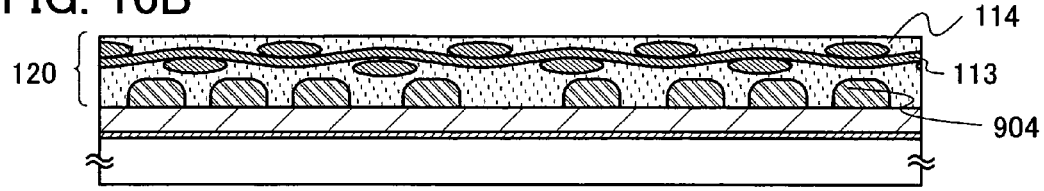

Next, as shown in FIG. 10B, as in Embodiment Mode 1 to 3, a composition containing an organic resin is applied from above the conductive layer 904 and the fibrous body 113, and baking is performed to form an organic resin layer 114.

Note that as with the above steps, the fibrous body may be provided over the conductive layer 904 and the organic resin layer 114 after forming the organic resin layer 114 over the conductive layer 904 instead of forming the organic resin layer 114 after providing the fibrous body 113 over the conductive layer 904.

Figure 10C:
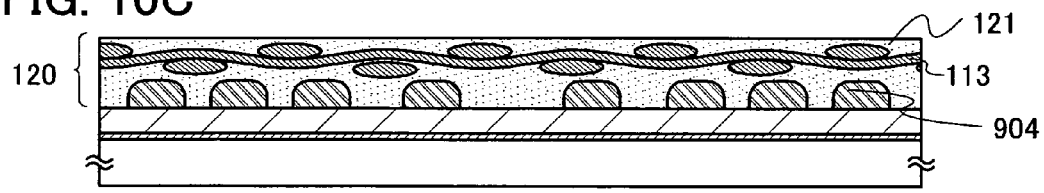

Then, the organic resin layer 114 is heated, and as shown in FIG. 10C, a sealing layer 120 including an organic resin layer 121 with which the fibrous body 113 is impregnated is formed on one side of the conductive layer 904 and one side of the insulating layer 103. It is to be noted that the organic resin layer 121 and the fibrous body 113 which are firmly fixed to one side of the conductive layer 904 and one side of the insulating layer 103 are collectively referred to as a sealing layer 120 in a similar manner to Embodiment Mode 1.

Figure 10D:
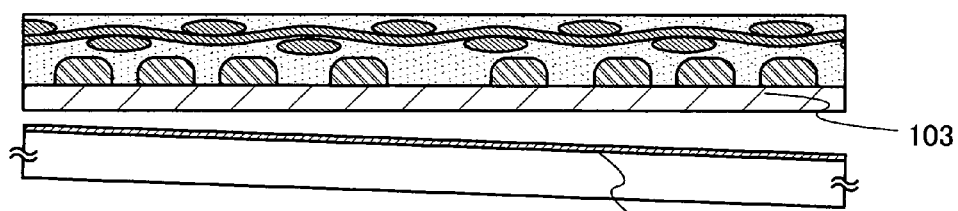

As shown in FIG. 10D, separation similar to that of Embodiment Modes 1 to 3 is performed, so that the insulating layer 103 is separated from the substrate 100 having an insulating surface.

Figure 10E:
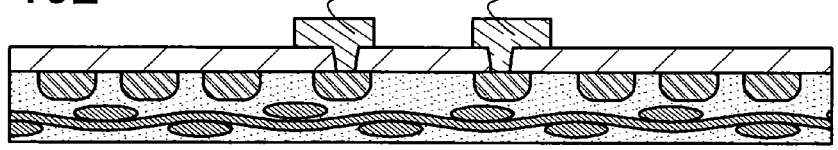

Then, part of the insulating layer 103 or the sealing layer 120 is removed to expose part of the conductive layer 904. Then, as shown in FIG. 10E, connection terminals 905a and 905b which are connected to the conductive layer 904 are formed. The connection terminals 905a and 905b can be formed in a similar manner to the connection terminal 161 described in Embodiment Mode 4. Instead of partial removal of the insulating layer 103, the sealing layer 120 may be partially removed and the connection terminals 905a and 905b may be formed.

Through the above steps, a substrate having a conductive layer serving as an antenna can be manufactured. Further, an RFID can be manufactured by connecting an element substrate to the antenna. The method is described below.

Figure 10F:
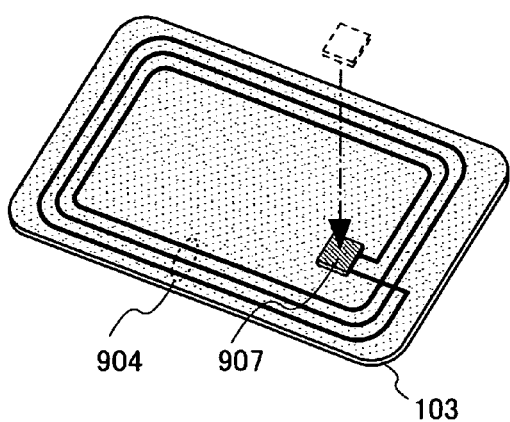

As shown in FIG. 10F, an element substrate 907 is disposed over the insulating layer 103. Electrical connection between a terminal portion of the element substrate and the conductive layer 904 is made by pressure bonding with the use of an anisotropic conductive material.

Moreover, when a plurality of conductive layers each serving as an antenna is formed in a stack including the conductive layer 904, the stack may be divided to form a plurality of stacks each having a conductive layer 904 serving as an antenna, and then, the element substrate may be connected to the conductive layer 904 of each of the stacks.

FIG. 10F shows an example in which the element substrate 907 with a smaller area than the insulating layer 103 is provided. However, there is no particular limitation thereon, and an element substrate with almost the same area as the insulating layer 103 may be provided, or an element substrate with a larger area than the insulating layer 103 may be provided.

Through the above steps, a semiconductor device serving as an IC tag is completed. Further, a semiconductor device which is not easily destroyed by local pressure can be manufactured.

It is to be noted that, finally, for the purpose of protection, the sealing layer in which the fibrous body is impregnated with the organic resin may be formed over the insulating layer 103 so as to cover the element substrate 907.

Embodiment Mode 6

This embodiment mode describes a structure and an application example of a semiconductor device of the present invention. Here, an RFID and a memory device are described as typical examples of a semiconductor device.

Figure 12:
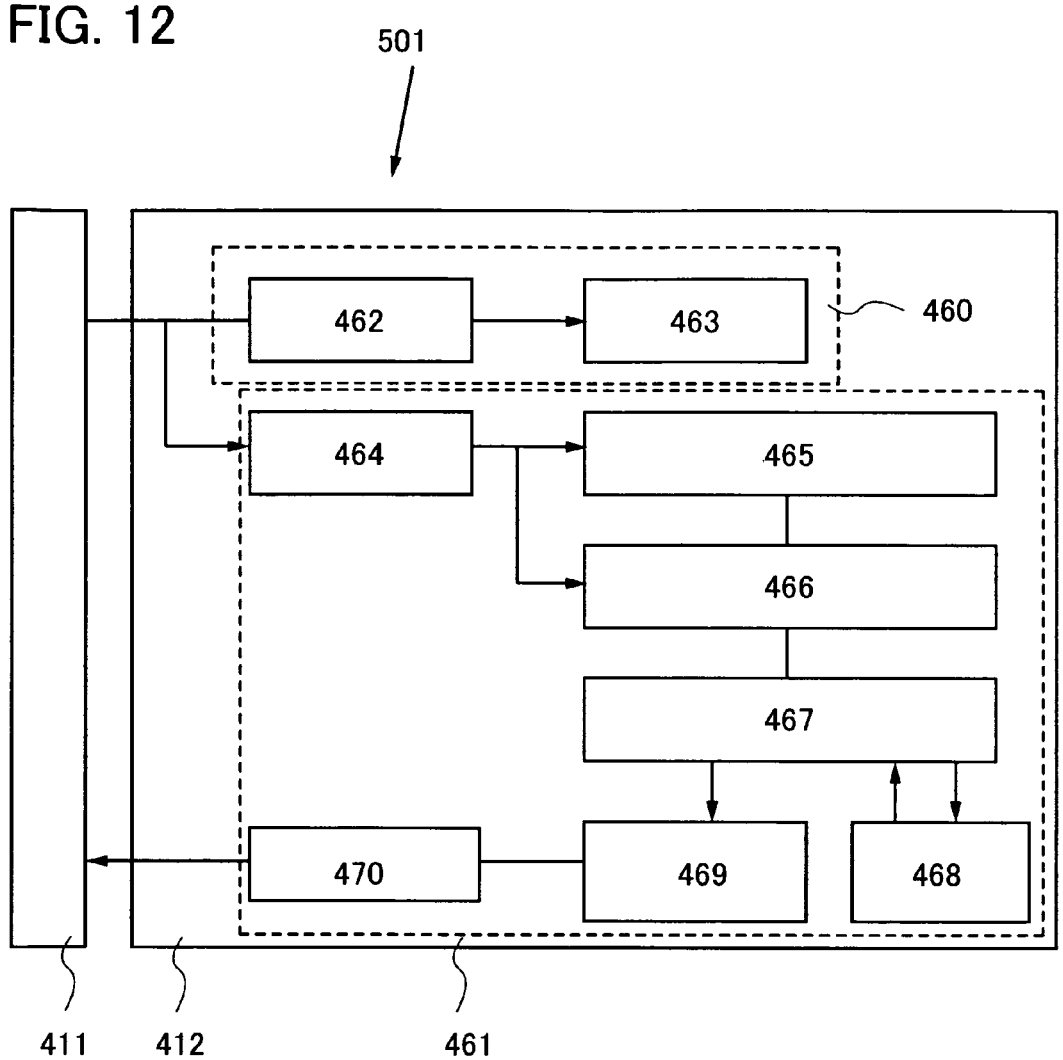
FIG. 12 is a diagram illustrating a semiconductor device of the present invention.

First, a circuit structure example of an RFID 501, which is one of the semiconductor devices of the present invention, is described. FIG. 12 shows a block circuit diagram of the RFID 501.

The RFID 501 in FIG. 12 conforms to specifications of ISO 15693 of the International Organization for Standardization, is a vicinity type, and has a communication signal frequency of 13.56 MHz. Further, reception only responds to a data reading instruction, data transmission rate in transmission is about 13 kHz, and the Manchester code is used for a data encoding format.

A circuit portion 412 of the RFID 501 is roughly separated into a power supply portion 460 and a signal processing portion 461. The power supply portion 460 includes a rectifying circuit 462 and a storage capacitor 463. Further, the power supply portion 460 may be provided with a protection circuit portion (also called a limiter circuit) to protect the internal circuit when the amount of electric power received by an antenna 411 is too large, and a protection circuit control circuit portion to control whether or not to operate the protection circuit portion. By providing the circuit portion, a malfunction can be prevented, which is caused by receiving the large amount of electric power by the RFID in such a situation in which a communication distance between the RFID and a communication instrument is extremely short. Thus, reliability of the RFID can be improved. That is, the RFID can be normally operated without degradation of an element in the RFID or destruction of the RFID itself.

Here, a communication instrument may have a means for transmitting and receiving information to/from the RFID by wireless communication, and for example, a reader which reads information, a reader/writer having a function of reading and a function of writing, and the like can be given. Further, a mobile phone, a computer, or the like having one of or both the function of reading and the function of writing is also included.

The rectification circuit 462 rectifies a carrier wave received by the antenna 411 and generates direct-current voltage. The storage capacitor 463 smoothes the direct-current voltage generated in the rectification circuit 462. The direct-current voltage generated in the power supply portion 460 is supplied to each circuit of the signal processing portion 461 as power supply voltage.

The signal processing portion 461 includes a demodulation circuit 464, a clock generation/correction circuit 465, a recognition/determination circuit 466, a memory controller 467, a mask ROM 468, an encoding circuit 469, and a modulation circuit 470.

The demodulation circuit 464 is a circuit that demodulates a signal received by the antenna 411. The received signal that is demodulated in the demodulation circuit 464 is input to the clock generation/correction circuit 465 and the recognition/determination circuit 466.

The clock generation/correction circuit 465 generates a clock signal that is necessary for operating the signal processing portion 461, and also has a function of correcting the clock signal. For example, the clock generation/correction circuit 465 includes a voltage controlled oscillator circuit (hereinafter referred to as "VCO circuit"), and turns an output from the VCO circuit into a feedback signal, makes a phase comparison with a supplied signal, and adjusts an output signal by negative feedback so that the feedback signal and a signal that is input are each in a certain phase.

The recognition/determination circuit 466 recognizes and determines an instruction code. The instruction code that is recognized and determined by the recognition/determination circuit 466 is an end-of-frame (EOF) signal, a start-of-frame (SOF) signal, a flag, a command code, a mask length, a mask value, or the like. Further, the recognition/determination circuit 466 has a cyclic redundancy check (CRC) function that identifies a transmission error.

The memory controller 467 reads data from a mask ROM based on a signal processed by the recognition/determination circuit 466. Further, an ID or the like is stored in the mask ROM 468. By mounting the mask ROM 468, the RFID 501 is formed to be dedicated to reading, so that replication or falsification is impossible. Paper which is prevented from forgery can be provided by embedding the RFID 501 dedicated to reading in paper.

The encoding circuit 469 encodes data that is read from the mask ROM 468 by the memory controller 467. The encoded data is modulated in the modulation circuit 470. The data modulated in the modulation circuit 470 is transmitted from the antenna 411 as a carrier wave.

Next, usage examples of an RFID are described. An RFID of the present invention can be used for various paper media and film media. In particular, the RFID of the present invention can be used for various paper media for which forgery prevention is necessary. The paper media are, for example, banknotes, family registers, residence certificates, passports, licenses, identification cards, membership cards, expert opinions in writing, patient's registration cards, commuter passes, promissory notes, checks, carriage notes, cargo certificates, warehouse certificates, stock certificates, bond certificates, gift certificates, tickets, deeds of mortgage, and the like.

Further, by implementing the present invention, a lot of information, more information than that which is visually shown on a paper medium, can be held in the paper medium or the film medium. Accordingly, by applying the RFID of the present invention to a product label or the like, electronic systemization of merchandise management or prevention of product theft can be realized. Usage examples of paper according to the present invention are described below with reference to FIGS. 13A to 13E.

Figure 13A:
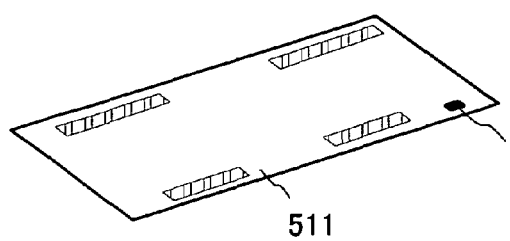
FIGS. 13A to 13E are perspective views each illustrating application examples of a semiconductor device of the present invention.
Figure 13B:
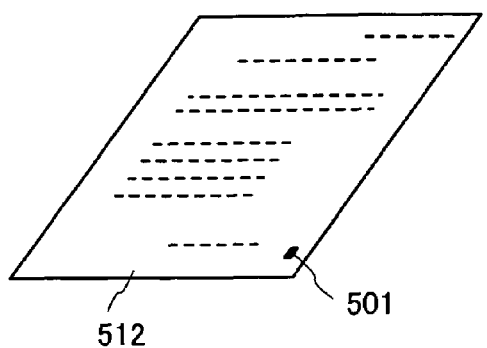

FIG. 13A is an example of a bearer bond 511 using paper embedded with an RFID 501 of the present invention. The bearer bond 511 includes a stamp, a ticket, an admission ticket, a gift certificate, a book coupon, a stationery coupon, a beer coupon, a rice coupon, various gift coupons, various service coupons, and the like, but of course the bearer bond 511 is not limited thereto. Further, FIG. 13B is an example of a certificate 512 using paper embedded with the RFID 501 of the present invention (for example, a residence certificate or a family register).

Figure 13C:
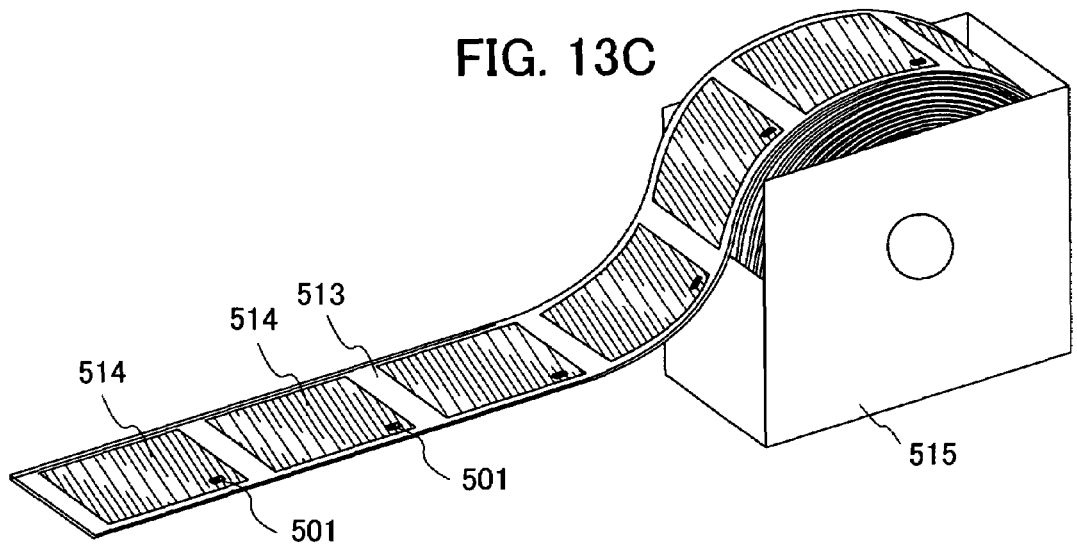

FIG. 13C is an example of applying the RFID of the present invention as a label. A label (ID sticker) 514 is formed of the paper embedded with the RFID 501, over a label base (separate paper) 513. The label 514 is stored in a box 515. On the label 514, information regarding a product or a service (such as product name, brand, trademark, trademark owner, seller, or manufacturer) is printed. Further, since a unique ID number of the product (or a category of the product) is stored in the RFID 501, forgery, infringement of intellectual property rights such as a trademark right or a patent right, and illegal activity such as unfair competition can be spotted easily. The RFID 501 can be input with a large amount of information that cannot all be written on a container or a label of the product, such as the product's area of production, area of sales, quality, raw material, effect, use, quantity, shape, price, production method, usage method, time of production, time of use, expiration date, instruction manual, and intellectual property information relating to the product, for example. Accordingly, a transactor or a consumer can access such information with a simple communication instrument. Further, the information can easily be rewritten, erased, or the like on a producer side, but cannot be rewritten, erased or the like on a transactor or consumer side.

Figure 13D:
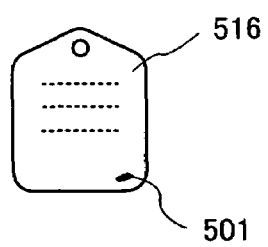
Figure 13E:
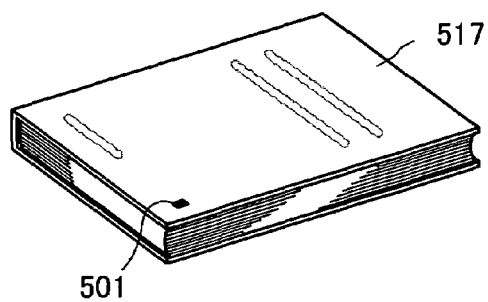

FIG. 13D shows a tag 516 formed of paper or a film which is embedded with the RFID 501. By manufacturing a tag 516 with the paper or film which is embedded with the RFID 501, the tag can be manufactured less expensively than a conventional ID tag using a plastic chassis. FIG. 13E shows a book 517 using the paper of the present invention for a cover, and the RFID 501 is embedded in the cover.

By attaching the label 514 or the tag 516 on which an RFID as an example of a semiconductor device of the present invention is mounted, to the product, merchandise management becomes easy. For example, when the product is stolen, the perpetrator can be spotted quickly by following a route of the product. In this manner, by using the RFID of the present invention for an ID tag, historical management of the product's raw material, area of production, manufacturing and processing, distribution, sales, and the like, as well as tracking inquiry becomes possible. That is, the product becomes traceable. Further, by the present invention, a tracing management system of the product can be introduced at lower cost than before.

An RFID which is an example of a semiconductor device of the present invention is not easily destroyed by local pressure. Accordingly, a paper medium and a film medium each having an RFID which is an example of a semiconductor device of the present invention can be curved in a process such as attachment or setting, leading to improvement of treatment efficiency. Further, since information can be written with a writing material to a paper medium or a film medium each having an RFID which is an example of a semiconductor device of the present invention, the range of uses is increased.

Next, a structure of a memory device which is one mode of a semiconductor device of the present invention is described below. Here, description is made by using a nonvolatile memory device as a typical example of a memory device.

FIG. 14 shows an example of a circuit block diagram of a nonvolatile semiconductor memory device. The nonvolatile semiconductor memory device includes a memory cell array 552 and a peripheral circuit 554 which are formed over the same element layer. The memory cell array 552 has a nonvolatile memory element as described in Embodiment Mode 1. A structure of the peripheral circuit 554 is as described below.

A row decoder 562 for selecting a word line and a column decoder 564 for selecting a bit line are provided around the memory cell array 552. An address is sent to a control circuit 558 through an address buffer 556, and an inner row address signal and an inner column address signal are transferred to the row decoder 562 and the column decoder 564, respectively.

Potential obtained by boosting power supply potential is used for writing and erasing of data. Therefore, a booster circuit 560 controlled by the control circuit 558 according to an operation mode is provided. Output of the booster circuit 560 is supplied to a word line or a bit line through the row decoder 562 and the column decoder 564. Data output from the column decoder 564 is input to a sense amplifier 566. Data read by the sense amplifier 566 is retained in a data buffer 568. Data retained in the data buffer 568 is accessed randomly by control by the control circuit 558, and is output through a data input/output buffer 570. Writing data is once retained in the data buffer 568 through the data input/output buffer 570 and is transferred to the column decoder 564 by control by the control circuit 558.

As described above, in the nonvolatile semiconductor memory device, potential that differs from the power supply potential is necessary to be used in the memory cell array 552. Therefore, it is desirable that at least the memory cell array 552 and the peripheral circuit 554 be electrically insulated and isolated. In this case, when a nonvolatile memory element and a transistor of a peripheral circuit are formed using a non-single crystal semiconductor layer formed over an insulating surface, insulation and isolation can be easily performed. Accordingly, a nonvolatile semiconductor memory device with no malfunction and low power consumption can be obtained.

Embodiment Mode 7

This embodiment mode describes an electronic device using a semiconductor device of the present invention.

As electronic devices to which a semiconductor device of the present invention is applied, cameras such as video cameras or digital cameras, goggle displays (head mounted displays), navigation systems, audio reproducing devices (e.g., car audio or audio component sets), computers, game machines, portable information terminals (e.g., mobile computers, mobile phones, portable game machines, or electronic books), and image reproducing devices provided with storage media (specifically, a device for reproducing the content of a storage medium such as a DVD (Digital Versatile Disc) and having a display for displaying the reproduced image) can be given. FIGS. 15A to 15E show specific examples of such electronic devices.

Figure 15A:
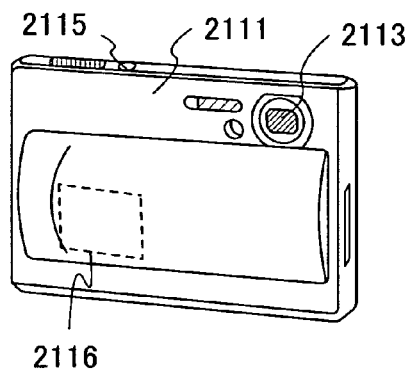
FIGS. 15A to 15E are views illustrating electronic devices to which a semiconductor device of the present invention can be applied.
Figure 15B:
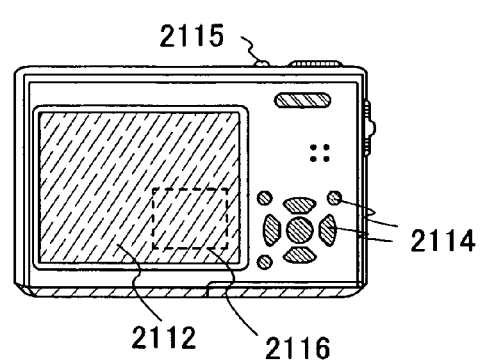

FIGS. 15A and 15B show digital cameras. FIG. 15B shows a rear side of FIG. 15A. This digital camera includes a housing 2111, a display portion 2112, a lens 2113, operating keys 2114, a shutter button 2115, and the like. A semiconductor device 2116 of the present invention which has a function as a storage device, an MPU, an image sensor, or the like is provided inside the housing 2111.

Figure 15C:
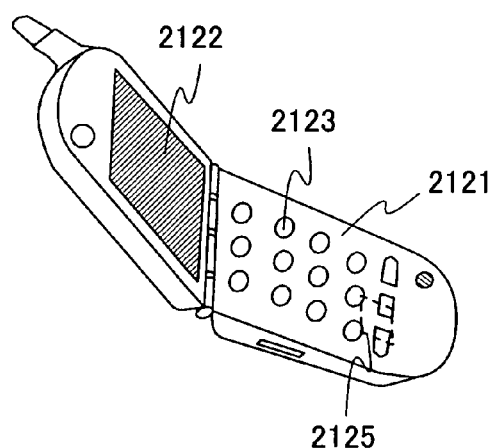

FIG. 15C shows a mobile phone which is one typical example of a portable terminal. This mobile phone includes a housing 2121, a display portion 2122, operating keys 2123, and the like. A semiconductor device 2125 of the present invention which has a function as a storage device, an MPU, an image sensor, or the like is provided inside the mobile phone.

Figure 15D:
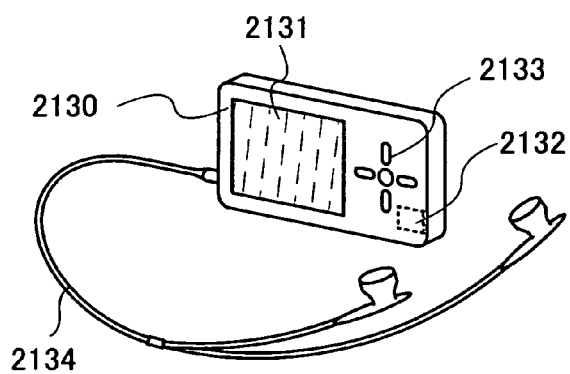

FIG. 15D shows a digital player which is one typical example of an audio device. The digital player shown in FIG. 15D includes a main body 2130, a display portion 2131, a semiconductor device 2132 of the present invention which has a function as a storage device, an MPU, an image sensor, or the like, an operating portion 2133, a pair of earphones 2134, and the like.

Figure 15E:
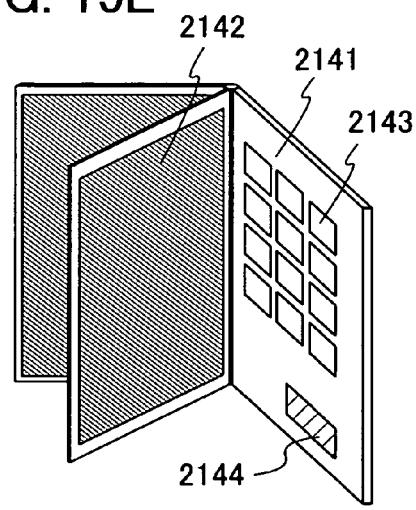
Figure 16A:
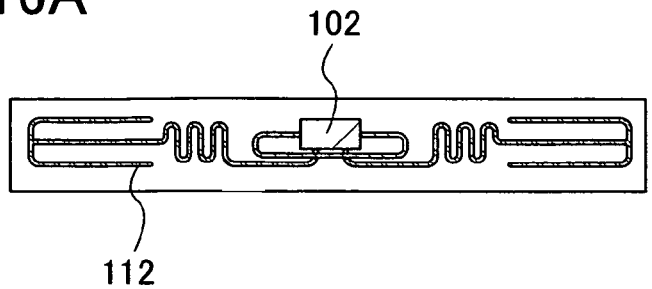
FIGS. 16A to 16D are top views each illustrating an antenna which can be applied to the present invention.
Figure 16B:
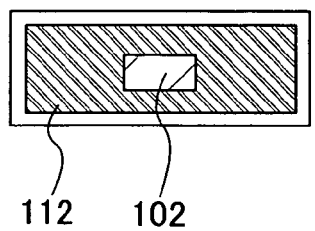
Figure 16C:
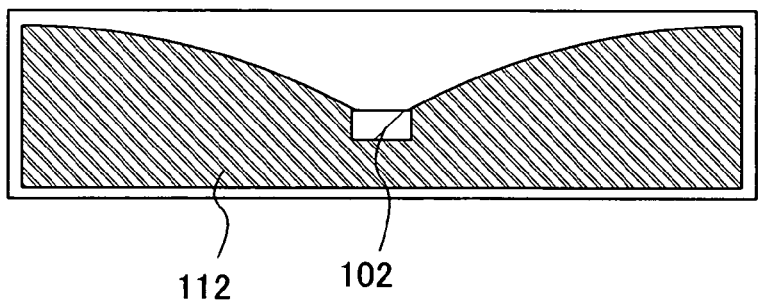
Figure 16D:
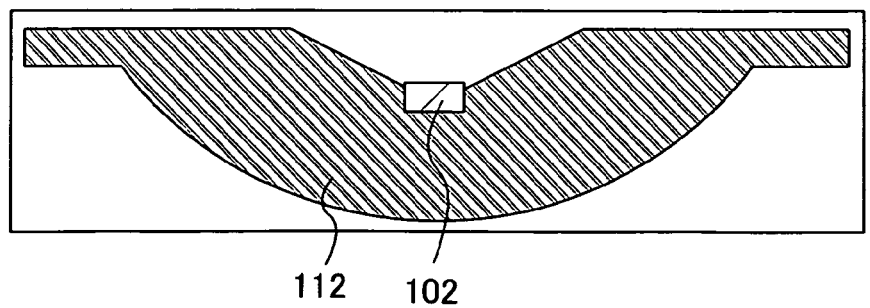

FIG. 15E shows an e-book device (also called an electronic paper). This e-book device includes a main body 2141, a display portion 2142, operating keys 2143, and a semiconductor device 2144 of the present invention which has a function as a storage device, an MPU, an image sensor, or the like. In addition, a modem may be built into the main body 2141, or a structure capable of wireless data transmission and reception may be employed.

In a manner described above, the applicable range of the semiconductor device of the present invention is so wide that the semiconductor device can be applied to other electronic devices.

This application is based on Japanese Patent Application serial no. 2007-079120 filed with Japan Patent Office on Mar. 26, 2007, the entire contents of which are hereby incorporated by reference.

What is claimed is:

1. A method of manufacturing a semiconductor device, comprising the steps of:

forming a separation layer over a substrate;

forming an element layer over the separation layer, wherein the element layer comprises an active element having a non-single crystal semiconductor layer and an insulating layer which covers the active element;

providing a fibrous body over the element layer;

applying a composition containing an organic resin from above the fibrous body to form an organic resin layer comprising the organic resin and the fibrous body so that the fibrous body is impregnated with the organic resin, heating the organic resin layer to form a sealing layer including the fibrous body and the organic resin; and separating the element layer and the sealing layer from the separation layer.

2. The method of manufacturing a semiconductor device according to claim 1, wherein the method further comprises a step of forming a wiring in the element layer and an antenna over the insulating layer so that the antenna is electrically connected to the non-single crystal semiconductor layer through the wiring.

3. The method of manufacturing a semiconductor device according to claim 1, further comprising the steps of:

forming a wiring in the element layer so that the wiring is electrically connected to the non-single crystal semiconductor layer; and providing an antenna so that the antenna is electrically connected to the active element through the wiring.

4. The method of manufacturing a semiconductor device according to claim 1, wherein the method further comprises a step of forming a protective film over the sealing layer.

5. The method of manufacturing a semiconductor device according to claim 1, wherein the fibrous body is formed of an organic compound or an inorganic compound.

6. The method of manufacturing a semiconductor device according to claim 1, wherein the active element is one or more of a thin film transistor, a nonvolatile memory element, and a diode.

7. The method of manufacturing a semiconductor device according to claim 1, wherein the substrate has an insulating surface over which the separation layer is provided.

8. A method of manufacturing a semiconductor device, comprising the steps of:

forming a separation layer over a substrate;

forming an element layer over the separation layer, wherein the element layer comprises an active element having a non-single crystal semiconductor layer and an insulating layer which covers the active element;

providing a first fibrous body over the element layer;

applying a first composition containing a first organic resin from above the first fibrous body to form a first organic resin layer comprising the first organic resin and the first fibrous body so that the first fibrous body is impregnated with the first organic resin, heating the first organic resin layer to form a first sealing layer including the first fibrous body and the first organic resin;

separating the element layer and the first sealing layer from the separation layer;

providing a surface of the element layer with a second fibrous body, wherein the surface is an opposite surface over which the first fibrous body is provided;

applying a second composition containing a second organic resin over the surface of the element layer to form a second organic resin layer comprising the second organic resin and the second fibrous body so that the second fibrous body is impregnated with the second organic resin; and heating the second organic resin layer to form a second sealing layer including the second fibrous body and the second organic resin.

9. The method of manufacturing a semiconductor device according to claim 8, wherein the method further comprises a step of forming a wiring in the element layer and an antenna over the insulating layer so that the antenna is electrically connected to the non-single crystal semiconductor layer through the wiring.

10. The method of manufacturing a semiconductor device according to claim 8, further comprising the steps of:

forming a wiring in the element layer so that the wiring is electrically connected to the non-single crystal semiconductor layer; and providing an antenna so that the antenna is electrically connected to the active element through the wiring.

11. The method of manufacturing a semiconductor device according to claim 8, wherein the method further comprises a step of forming a protective film over any of the first sealing layer and the second sealing layer.

12. The method of manufacturing a semiconductor device according to claim 8, wherein the first fibrous body and the second fibrous body are formed of an organic compound or an inorganic compound.

13. The method of manufacturing a semiconductor device according to claim 8, wherein the active element is one or more of a thin film transistor, a nonvolatile memory element, and a diode.

14. The method of manufacturing a semiconductor device according to claim 8, wherein the substrate has an insulating surface over which the separation layer is provided.

15. A method of manufacturing a semiconductor device, comprising the steps of:

forming a separation layer over a substrate;

forming an element layer over the separation layer, wherein the element layer comprises an active element having a non-single crystal semiconductor layer and an insulating layer which covers the active element;

applying a composition containing an organic resin over the element layer to form an organic resin layer, providing a fibrous body over the organic resin layer so that the fibrous body is included in the organic resin layer and impregnated with the organic resin;

heating the organic resin layer to form a sealing layer including the fibrous body and the organic resin; and separating the element layer and the sealing layer from the separation layer.

16. The method of manufacturing a semiconductor device according to claim 15, wherein the method further comprises a step of forming a wiring in the element layer and an antenna over the insulating layer so that the antenna is electrically connected to the non-single crystal semiconductor layer through the wiring.

17. The method of manufacturing a semiconductor device according to claim 15, further comprising the steps of:

forming a wiring in the element layer so that the wiring is electrically connected to the non-single crystal semiconductor layer; and providing an antenna so that the antenna is electrically connected to the active element through the wiring.

18. The method of manufacturing a semiconductor device according to claim 15,
wherein the method further comprises a step of forming a protective film over the sealing layer.

19. The method of manufacturing a semiconductor device according to claim 15,
wherein the fibrous body is formed of an organic compound or an inorganic compound.

20. The method of manufacturing a semiconductor device according to claim 15,
wherein the active element is one or more of a thin film transistor, a nonvolatile memory element, and a diode.

21. The method of manufacturing a semiconductor device according to claim 15,
wherein the substrate has an insulating surface over which the separation layer is provided.

22. A method of manufacturing a semiconductor device, comprising the steps of:
forming a separation layer over a substrate;
forming an element layer over the separation layer, wherein the element layer comprises an active element having a non-single crystal semiconductor layer and an insulating layer which covers the active element;
applying a first composition containing a first organic resin over the element layer to form a first organic resin layer;
providing a first fibrous body over the first organic resin layer so that the first fibrous body is included in the first organic resin layer and impregnated with the first organic resin;
heating the first organic resin layer to form a first sealing layer including the first fibrous body and the first organic resin;
separating the element layer and the first sealing layer from the separation layer;
applying a second composition containing a second organic resin on a surface of the element layer, wherein the surface is an opposite surface over which the first composition is applied;
providing a second fibrous body over the second composition containing the second organic resin to form a second organic resin layer comprising the second organic resin and the second fibrous body so that the second fibrous body is impregnated with the second organic resin; and
heating the second organic resin layer to form a second sealing layer including the second fibrous body and the second organic resin.

23. The method of manufacturing a semiconductor device according to claim 22,
wherein the method further comprises a step of forming a wiring in the element layer and an antenna over the insulating layer so that the antenna is electrically connected to the non-single crystal semiconductor layer through the wiring.

24. The method of manufacturing a semiconductor device according to claim 22, further comprising the steps of:
forming a wiring in the element layer so that the wiring is electrically connected to the non-single crystal semiconductor layer; and
providing an antenna so that the antenna is electrically connected to the active element through the wiring.

25. The method of manufacturing a semiconductor device according to claim 22,
wherein the method further comprises a step of forming a protective film over any of the first sealing layer and the second sealing layer.

26. The method of manufacturing a semiconductor device according to claim 22,
wherein the first fibrous body and the second fibrous body are formed of an organic compound or an inorganic compound.

27. The method of manufacturing a semiconductor device according to claim 22,
wherein the active element is one or more of a thin film transistor, a nonvolatile memory element, and a diode.

28. The method of manufacturing a semiconductor device according to claim 22,
wherein the substrate has an insulating surface over which the separation layer is provided.

* * * * *